United States Patent [19]

Golladay

[11] Patent Number: 5,404,110

[45] Date of Patent: Apr. 4, 1995

[54] SYSTEM USING INDUCED CURRENT FOR CONTACTLESS TESTING OF WIRING NETWORKS

[75] Inventor: Steven D. Golladay, Hopewell Junction, N.Y.

[73] Assignee: International Business Machines Corporation, Armonk, N.Y.

[21] Appl. No.: 36,781

[22] Filed: Mar. 25, 1993

[51] Int. Cl.⁶ .......................................... G01R 31/26

[52] U.S. Cl. ................... 324/751; 324/501; 250/310

[58] Field of Search ........... 324/501, 537, 158 R, 324/158 D, 751, 752; 250/310, 311

[56] References Cited

U.S. PATENT DOCUMENTS

| | | | |
|---|---|---|---|
| 3,315,157 | 4/1967 | Watanabe et al. | 324/701 |
| 3,764,898 | 10/1973 | Bohlen et al. | 324/501 |
| 4,277,679 | 7/1981 | Feuerbaum | 250/310 |
| 4,573,008 | 2/1986 | Lischke | 324/158 R |
| 4,721,855 | 1/1988 | Fazekas | 250/310 |
| 4,803,430 | 2/1989 | Shinada et al. | 324/501 X |
| 4,829,243 | 5/1989 | Woodard, Sr. et al. | 324/158 R |
| 4,843,312 | 6/1989 | Hartman et al. | 324/158 R |
| 4,843,330 | 6/1989 | Golladay et al. | 324/158 R |
| 4,887,031 | 12/1989 | Brust | 324/158 R |
| 4,943,769 | 7/1990 | Golladay et al. | 324/158 R |
| 4,970,461 | 11/1990 | LePage | 324/158 F |
| 4,996,659 | 2/1991 | Yamaguchi et al. | 364/579 |
| 5,017,863 | 5/1991 | Mellitz | 324/158 R |
| 5,030,908 | 7/1991 | Miyoshi et al. | 324/158 R |
| 5,057,773 | 10/1991 | Golladay et al. | 324/158 R |
| 5,097,204 | 3/1992 | Yoshizawa et al. | 324/158 R |
| 5,124,660 | 6/1992 | Cilingiroglu | 324/538 |
| 5,128,545 | 7/1992 | Komi | 250/310 |

FOREIGN PATENT DOCUMENTS

| | | | |
|---|---|---|---|
| 0424270 | 4/1991 | European Pat. Off. | G01R 31/302 |
| 0490154 | 6/1992 | European Pat. Off. | G01R 31/305 |
| 60-189953 | 9/1985 | Japan . | |
| 01-199172 | 8/1989 | Japan . | |
| 855544 | 8/1981 | U.S.S.R. | G01R 31/02 |

OTHER PUBLICATIONS

Proc. XIth Int. Cong. on Electron Microscopy, Kyoto, Jan. 1986, Pfeiffer, et al., "A Practical E-Beam System for High Speed Continuity Testing of Conductor Networks", pp. 185–188.

IBM Technical Disclosure Bulletin, vol. 24, No. 11A, Apr. 1982, Chang, et al. "Tri-Potential Method for Testing Electrical Opens and Shorts in Multilayer Ceramic Packaging Modules", pp. 5388–5390.

Microelectronic Engineering 12, pp. 253–258 (Dec. 1990), Brunner, et al., "CAD-Based Electron-Beam Testing of Micropackaging Boards".

Microelectronic Engineering 8, pp. 25–34 (Aug. 1988), Brunner et al., "Bare-Board E-Beam Testing: The Charge Storage Problem".

IBM Journal of Research and Development, vol. 34, No. 2/3, Mar./May 1990, Golladay, et al., "Electron-Beam Technology for Open/Short Testing of Multi-Chip Substrates", pp. 250–259.

Journal of Applied Physics, vol. 45, No. 2, Feb. 1974, Chung, et al., "Simple Calculation of Energy Distribution of Low-Energy Secondary Electrons Emitted from Metals Under Electron Bombardment", pp. 707–709.

Microelectronic Engineering 12, pp. 97–104 (Dec. 1990), Golladay, "A Voltage Contrast Detector for Electrical Testing of Multi-Chip Substrates".

Journal of Vacuum Science & Technology, B 9 (4), Jul./Aug. 1991, Lee, et al., "Surface Grid Technique for Noncontact E-Beam Testing of Very Large Scale Integrated Package Substrate", pp. 1993–2005.

*Primary Examiner*—Kenneth A. Wieder
*Assistant Examiner*—Glenn W. Brown
*Attorney, Agent, or Firm*—Michael J. Balconi-Lamica; Graham S. Jones, II

[57] ABSTRACT

A method for measuring electrical characteristics of an electrical device having a conductive structure associated therewith involves the sequence of steps as follows: First, employ a low energy electron beam to charge all conductors on the surface of the device. Expose individual conductors to a focussed low energy electron beam serially. Make measurements of an induced current signal when individual conductors are exposed to the focussed electron beam. Analyze induced current measurements derived from the individual conductors. Then determine electrical characteristics of the device based on the analysis. A charge storage method and three capacitive test methods for defect detection and methods for shorts delineation are described.

20 Claims, 22 Drawing Sheets

SYSTEM USING INDUCED CURRENT FOR CONTACTLESS TESTING OF WIRING NETWORKS

BACKGROUND OF THE INVENTION

1. Field of the Invention

This invention relates to apparatus and methods for the contactless testing of conducting networks on an insulating body, and more particularly testing for electrical opens between network elements which should be electrically connected, testing for electrical shorts between networks which should be isolated, and for the measurement of network capacitance.

2. Description of Related Art

In the production of multi-chip modules (MCM's) it is important to test the component parts of the modules for defects before assembly to minimize the cost of repairing such defects and to maximize the yield of operable devices. One aspect of component testing is the detection of opens and shorts in the conductor networks of the substrate on which the integrated circuits are mounted. Prior art opens/shorts testers can be divided into two classes; those which contact the substrate nodes mechanically, and those which are contactless testers.

MECHANICAL TESTERS

Mechanical probe systems too often damage substrates, add particulate contamination, have limited throughput, are not applicable to feature sizes below approximately 25 micrometers, or to small features recessed into insulators. However, the capacitive defect detection technique used by some probe testers is relevant to the present invention. These systems work by physically and electrically contacting each of the network nodes serially and measuring the node capacitance relative to an internal or an external conductive plane. Measured capacitances are compared to those obtained from a known good part or by other means such as theoretical calculations. A short between nets will change the capacitance of one net (the one with the smaller capacitance) by at least a factor of two. Similarly an open will change the capacitance of at least one node of the net (that part connected to the smaller net fragment) by at least a factor of $\frac{1}{2}$.

CONTACTLESS TESTERS

Contactless test systems are of interest because of the limitations and difficulties of mechanical probe systems. There are two classes of contactless testers, voltage contrast testers and induced current testers.

Prior Art Voltage Contrast Testers

A number of contactless substrate testing systems have been described heretofore, which include as follows:

Pfeiffer et al., "A Practical E-Beam System for High Speed Continuity Testing of Conductor Networks," Proc. XIth Int. Cong. on Electron Microscopy, Kyoto, pp 185–188 (1986).

Chang et al., "Tri-Potential Method for Testing Electrical Opens and Shorts in Multilayer Ceramic Modules," IBM Tech. Bull., Vol. 24, 11A, pp 5388–5390 (April, 1982).

Brunner et al., "CAD-Based Electron Beam Testing of Micropackaging Boards", Microelectronic Engineering 12, pp 253–258 (1990).

Brunner et al., "Bare-Board E-beam Testing: The Charge Storage Problem", Microelectronic Engineering 8 (1988) pp 25–35.

U.S. Pat. No. 4,829,243 of Woodard et al for "Electron Beam Testing of Electronic Components" uses E-beam testing, with an extraction grid above the substrate, and a retarding grid above the extraction grid.

All of the contactless substrate testing systems cited above use voltage contrast secondary electron detectors, and a test methodology which exploits charge storage on networks to detect shorts. With this test method, continuity within a network is confirmed by charging one node of a net, then checking that other nodes of the net have been charged to the potential of the first node by directing the electron beam to these nodes. The potential of those nodes is inferred from the output signal of a voltage contrast secondary electron detector. Note that the continuity test leaves networks charged. Having verified continuity within a net, the tester proceeds to the next net. However, the potential of each network is measured before the continuity test is performed, i.e., before the network is charged. If a network is found to be charged on the pre-charging measurement, a short to a previously tested network is inferred. Ideally this test sequence is repeated until all nets are charged and tested. For successful shorts detection the first net tested must retain its charge until the last net is tested. The required charge storage time can be reduced somewhat by using the "segmented" test method of Golladay et al described in U.S. Pat. No. 4,943,769 for "Apparatus and Method for Opens/Shorts Testing of Capacitively Coupled Networks An Substrates Using Electron Beams." In Golladay et al only a fraction of the nets are charged, then checked for shorts against the remaining nets; charge storage times of seconds to tens of seconds are required at a minimum. This time implies that networks must be isolated by insulation resistances as high as $10^{14}$ ohms. This requirement cannot be met by some insulators and even for the best insulators, small amounts of surface contamination may cause sufficient charge leakage that networks isolated by $10^{12}$ ohms may appear shorted.

Also implicit in the simple description of the test sequence above, is the assumption that all nodes to be tested are readily accessible to the electron beam, i.e., that the beam can be positioned on any node by electrical beam deflection. We will refer to this as full substrate deflection. If a test system is incapable of full substrate deflection, i.e., some nodes are only accessible if the substrate or electron optical system is mechanically repositioned, an inherently much slower operation, test times will dramatically lengthen and/or test sequences will become more complex to minimize mechanical motion. If, in addition a "segmented test" is required because of the capacitive coupling effects between networks (Ref. Golladay et al U.S. Pat. No. 4,943,769 supra), the substrate must be repositioned so that each subfield can be accessed multiple times. In this case the number of mechanical steps required increases dramatically, with corresponding increases in test time. Longer test times in turn exacerbate the problems of charge leakage.

Although, full substrate deflection is almost essential for reasonable tester throughput with the charge storage test method, as substrate technology advances producing smaller features which must be tested, full substrate deflection becomes increasingly difficult to achieve. As the features shrink the electron beam which can be used to probe them must shrink correspondingly. As the E-beam probe size shrinks, it becomes increasingly more difficult to maintain the probe size over large deflection fields. The necessity to accommodate a voltage contrast detector near the substrate further complicates the design of the electron optical system, and may limit the minimum obtainable beam size.

Another problem with many prior art test systems relates to insulator charging. If a high energy electron beam is used for conductor charging, the beam energy needed to charge the conductor unfortunately will charge the insulator very rapidly, as well. Insulator charging, whether inadvertent as in the case of beam spill over from a conductor, or intentional, as might be the case when a substrate is scanned for registration purposes, can result in very strong local fields which interfere with the voltage contrast signal detection. While it is possible in principle to avoid insulator charging by simply never allowing the beam to hit the insulator, this solution is not easily implemented. An alternative approach where the insulator charging can be discharged by the use of a second focused low energy beam has been described by Golladay, S. D., Wagner, N. A., Rudert, J. R., Schmidt, R. N., "Electron Beam Technology for Open/short Testing of Multi-chip Substrates" IBM Journal of Research and Development, 34, 2/3, (March/May, 1990) pp 250–259, but this approach requires a complex electron optical column and column control electronics.

In summary voltage contrast test systems known from the literature have one or more of the following problems or disadvantages:
 i. Charge leakage.
 ii. Need for full substrate deflection.
 iii. Insulator charging problems.
 iv. Complex column and/or column control electronics.

Prior Art Induced Current Testers

Contactless test systems are known wherein an induced current signal is detected rather than a voltage contrast signal.

U.S. Pat. No. 5,017,863 of Mellitz for "Electro-Emissive Laser Stimulated Test" teaches induced current signal detection in a system using a laser and an electron-emissive grid to charge networks.

Naruo, in Japanese Patent 199,172 also detects induced current but in his case the primary beam acceleration voltage is switched to generate an alternating induced current whose phase shift is measured.

Dodoka in USSR patent No. 855,544 "Device for Testing Printed Circuit Boards" describes a system similar in some respects to the present invention but there are important factors in the workings of his system which would prevent the application of his system to achieve the objectives of this invention. The Dodoka system is not contactless since a metal plate is used to make physical contact to the substrate to establish the initial network charge. Moreover this plate is used to establish an initial positive charge which is subsequently discharged by a raster scanned electron beam. Under these conditions the induced current signal will not in general be representative of the capacitance of the networks.

ADDITIONAL REFERENCES

Additional references of interest are as follows:
U.S. Pat. No. 5,057,773 of Golladay et al "Method for Opens/Shorts Testing of Capacitively Coupled Networks in Substrates Using Electron Beams".

U.S. Pat. No. 5,097,204 of Yoshizawa et al for "Method and Apparatus for Evaluating the Capacitance of an Integrated Electronic Device using an E Beam."

U.S. Pat. No. 4,277,679 of Feuerbaum for "Apparatus and Method for Contact-Free Potential Measurements of an Electronic Composition".

Chang, M. S., Everhart, T., E. "Simple calculation of energy distribution of low energy secondary electrons emitted from metal under electron bombardment", J. of Appl. Phys., Vol. 45, pp 707–709 (1974).

Golladay, S. D., "A Voltage Contrast Detector for Electrical Testing of Multi-chip Substrates", Microelectronic Engineering 12 (1990) pp 97–104.

Lee, K. L., et al "Surface grid technique for non-contact E-beam Testing of VLSI package Substrate" Journal of Vacuum Science & Technology, B 9 (4), pp 1993–2005 (1991).

OBJECTS OF THE INVENTION

An object of this invention is to provide a contactless test system which is simpler and less expensive to construct and to operate.

Another object of this invention is to provide a test system and test method which avoids insulator charging, thereby extending the applicability of the system to substrates with various combinations of insulators and conductors including combinations such as gold and polyimide which present difficulties for many voltage contrast testers.

Another object is to provide a system and test method for detection of open and short defects which does not require deflection field coverage of the entire substrate and is therefore applicable to larger substrates with smaller features.

Still another object is that the testing system be applicable to substrates with only moderate insulation resistance between networks as contrasted with testing systems which require the substrate insulation resistance to be very high.

Still another object of the present invention is to provide a system and methods whereby net capacitance can be measured contactlessly.

In accordance with this method, a system and method for measuring electrical characteristics of an electrical device has a conductive structure associated therewith involving the sequence of functions/steps as follows:
 a) employ a low energy electron beam to charge all conductors on the surface of the device,
 b) expose individual conductors to a focussed low energy electron beam serially,
 c) make measurements of an induced current signal when individual conductors are exposed to the focussed electron beam,
 d) analyze induced current measurements derived from the individual conductors, and
 e) determine electrical characteristics of the device based on the analysis.

Preferably before exposure with the focussed electron beam, the device is subjected to a modified electrostatic field; the analysis of induced current signals is made by comparison of a feature of the induced current signals with a predetermined standard; the measurement is made of an induced current in a conductive structure external to the device; the measurement of induced current is made on internal metallization in the device; and the measurement of induced current is made by a current amplifier.

A system and method measures and analyzes induced current to determine an electrical characteristic of a particular node. Preferably the measurement is integrated to determine an electrical characteristic of a particular node on the device; the measurement is fitted by a function to determine an electrical characteristic of a particular node to be tested on the device; and the function for fitting the measurement is exponential.

In accordance with another aspect of this invention a system and method is provided for measuring electrical characteristics of a device has a conductive structure associated therewith, the system and method involve the sequence of functions/steps as follows:
  a) apply an electrostatic field proximate to the device,
  b) employ a low energy electron beam to charge the surface metallization on all nodes on the device while the electrostatic field is applied thereto,
  c) turn the beam off and change the electrostatic field to a different value,
  d) direct a focussed, low energy, electron beam at a element to be tested on the device,
  e) measure the induced current on the conductive structure through capacitive coupling to the conductive structure, and
  f) analyze induced current signals derived from the individual conductors.

Preferably, additional the functions/steps are included as follows:
  g) select a particular element of a network on the device,
  h) direct the focussed electron beam at the element for a time required for the induced current signal to change in amplitude by a predetermined amount
  i) direct the focussed electron beam at different nodes in the same network to be tested as the particular element for a predetermined interval, and
  j) measure the induced current signal from each of the nodes to determine whether electrical continuity exists.

Preferably the measurement is made of an induced current in a conductive structure external to the device; the measurement of induced current are made on internal metallization in the device; and the measurement of induced current are made by a current amplifier.

A system and method in accordance with the present invention is on in which the measurement is analyzed to determine an electrical characteristic of a particular node; the measurement is integrated to determine an electrical characteristic of a particular node to be tested on the device; the measurement is fitted by a function to determine an electrical characteristic of a particular node to be tested on the device; and the function for fitting the measurement is exponential.

A process for investigation of defects in electrical devices comprises:
a) employing an induced current signal to detect at least one node connected to a defect, and
b) delineation of all conductors connected to the at least one node connected to the defect.

Preferably, the process is enhanced by analysis of capacitance values; before exposure with a focussed electron beam, the device is subjected to a modified electrostatic field; during the delineation analysis of induced current signals is made by comparison of a feature of the induced current signals with a predetermined standard; measurement is made of induced current in a conductive structure external to the device; measurement is made of induced current in internal metallization in the device; measurement of induced current is made by a current amplifier; measurements are analyzed to determine an electrical characteristic of a particular node; and the measurement is integrated to determine an electrical characteristic of a particular node to be tested on the device; and the measurement is fitted by a function to determine an electrical characteristic of a particular node to be tested on the device; and the function for fitting the measurement is exponential.

A system and method for measuring electrical characteristics of an electrical device involve the sequence of functions/steps as follows:
  a) employ an electron beam to charge substantially all conductors on the surface of the device,
  b) change the electrostatic field on the device,
  c) direct an E-beam upon individual conductors on the device,
  d) analyze the dynamic behavior of signals produced by the E-beam, and
  e) compare the signals with a standard to identify conductors with predetermined capacitive characteristics.

A system and method for delineation of the conductors shorted together is performed, by the functions/steps as follows:
  a) division of the surface of the device into sectors, and
  b) testing the elements with substantially matching sets of capacitive values from sector to sector one sector at a time to identify conductors has shorts between them measuring induced current signals, and involve a comparison with a predetermined standard.

A system and method for measuring electrical characteristics of a device involve the sequence of functions/steps as follows:
  a) apply a bias potential on a grid above the device,
  b) employ a low energy electron beam to charge the surface metallization on all nodes on the device while the bias potential is on the grid,
  c) turn the beam off and change the lower grid to a different potential,
  d) direct a focussed, low energy, electron beam at a node to be tested on the device for a predetermined interval,
  e) measure the induced current on the conductive structure through capacitive coupling to the conductive structure of the device,
  f) direct the second focussed electron beam at the node to be tested on the device for a substantially longer interval,
  g) direct the focussed electron beam at different nodes in the same network to be tested on the device for a predetermined interval, and
  h) measure the induced current signal from each of the nodes to determine whether electrical continuity exists.

A system and method for measuring an electrical device involve the sequence of functions/steps as follows:
  a) apply a relatively negative bias potential on a grid above the device, b) employ an electron beam to charge the surface metallization on all nodes on the device uniformly while the relatively negative bias potential is on the grid, c) turn the beam off and raise the upper grid to a higher potential, d) direct a focussed, low energy, electron beam at a node to be tested on the device for a predetermined interval, e) measure the induced current on a conductive structure through capacitive coupling to the surface metallization of the device, f) direct the focussed electron beam at the node to be tested on the device for a substantially longer interval, g) direct the focussed electron beam at a node of different nets to be tested on the device for a predetermined interval, and h) measure the induced current signal from each of the nodes to determine whether electrical shorts exist.

A system and method for testing an electrical device involve the sequence of functions/steps as follows:

a) apply a bias potential on a grid above the device, b) employ an electron beam to charge the surface metallization on all nodes on the device while the bias potential is on the grid, c) turn the beam off and change the grid to a different potential, d) direct the electron beam at a node to be tested on the device, e) measure the induced current on the conductive structure through capacitive coupling to the conductive structure of the device, f) analyze induced current measurement derived from the individual portions of the conductive structure, and g) determine electrical characteristics of the device based on that analysis.

Preferably the measurement of is made of induced current in a conductive structure external to the device; or the measurement of induced current is made on internal metallization in the device, and the measurement of induced current is made by a current amplifier.

A system and method of measurement provides analysis to determine an electrical characteristic of a particular node; the measurement is integrated to determine an electrical characteristic of a particular node to be tested on the device; or the measurement is fitted by a function to determine an electrical characteristic of a particular node to be tested on the device.

A system and method for testing an electrical device involve the sequence of functions/steps as follows:

a) apply a relatively negative bias potential on a lower grid above the device and apply a relatively low potential to a second upper grid, b) employ an electron beam to charge the surface metallization on all nodes on the device uniformly while the relatively negative bias potential is on the grid, c) turn the beam off and raise the lower grid to a higher potential, d) direct the electron beam at a node to be tested on the device, e) measure the induced current on the surface metallization through capacitive coupling to the metallization of the device, f) analyze induced current measurement derived from the individual portions of the metallization, and g) determine electrical characteristics of the device based on that analysis.

Preferably the measurement is made of induced current in a conductive structure external to the device; the measurement of induced current is made on internal metallization in the device; and the measurement of induced current is made by a current amplifier. A system and method of measurement analyzes induced current to determine an electrical characteristic of a particular node; the measurement is integrated to determine an electrical characteristic of a particular node to be tested on the device; the measurement is fitted by a function to determine an electrical characteristic of a particular node to be tested on the device; and the function for fitting the measurement is exponential.

BRIEF DESCRIPTION OF THE DRAWINGS

The foregoing and other aspects and advantages of this invention are explained and described below with reference to the accompanying drawings, in which:

FIG. 4A illustrates the equilibrium potential of the isolated sphere as a function of the secondary electron yield, $\alpha$, of the material, using the model and assumptions of Appendix A.

FIG. 4B illustrates the ratio of the induced current signal to the primary beam current as a function of the potential V of the isolated sphere calculated according to Appendix A.

FIG. 4C illustrates the calculated ratio of the induced current signal to the primary beam current, $I_c(t)/I_p$ as a function of time for various initial potentials of the floating conductor.

FIG. 4D illustrates $I_c(t)/I_p$ for two isolated spheres with different capacitances.

FIG. 4E illustrates the data of FIG. 4D plotted on a semi-logarithmic scale.

DESCRIPTION OF THE PREFERRED EMBODIMENT

1. Electron Beam Charging

Figure 1:
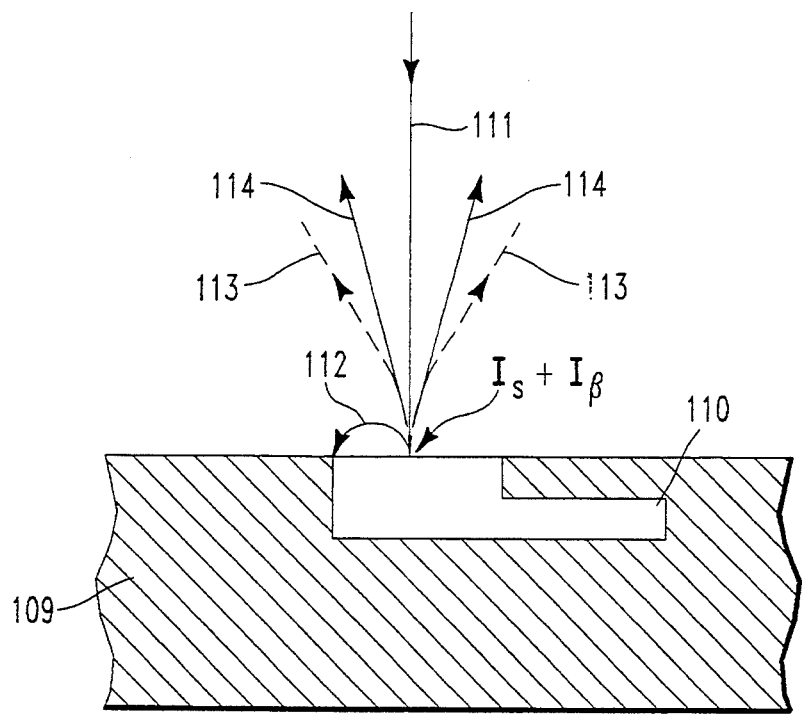
FIG. 1 illustrates the remission of electrons which results when an isolated conductor is irradiated with an energetic primary electron beam.

The operation of the preferred embodiments of this invention can be best understood after an account of the characteristics of the induced current signal. To that end consider an insulating substrate 109 containing an isolated electrical conductor 110 irradiated by an electron beam 111 as illustrated in FIG. 1. When an energetic electron beam 111, the "primary beam", irradiates a solid material 110, the collision processes result in re-emission of electrons. The electron emission current is conventionally divided into two categories; secondary electrons (SE) 112 and 113 having kinetic energy $<50$ ev and back-scattered electrons (BSE) 114 having higher energies. The net effective charging current, $I_c$, depends on the balance between electron injection current, $I_p$, SE and BSE re-emission current, $I_s$ and $I_b$ respectively, and SE reabsorption current, $I_r$, since some low energy SE 112 may be returned to the conductor 110 by local electric fields.

Figure 2:
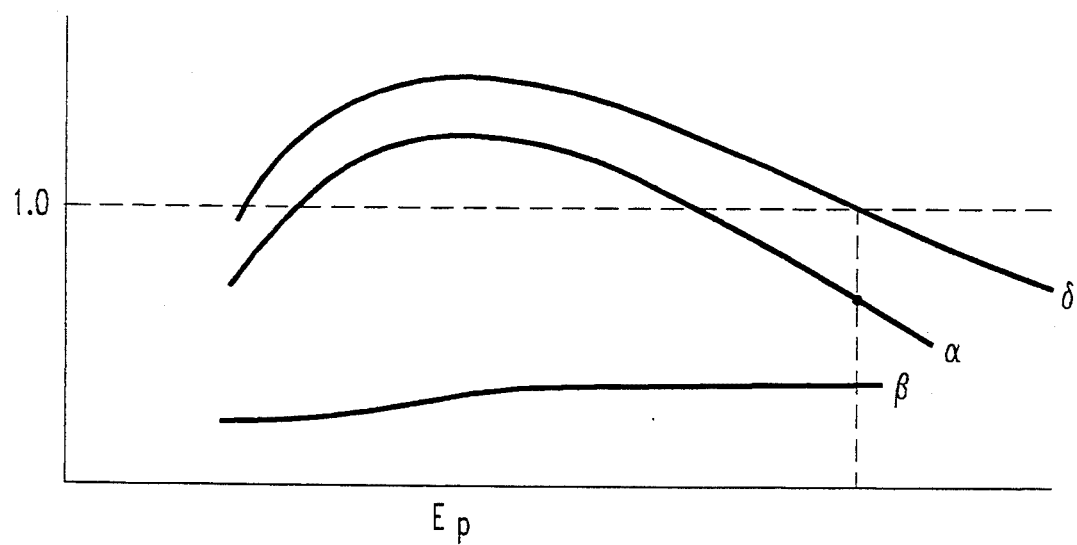
FIG. 2 illustrates the total yield of re-emitted electrons, $\delta$, and its component parts, secondary electron (SE) yield, $\alpha$, and the backscattered electron yield, $\beta$, for a typical metal as a function of primary beam energy, $E_p$.

The ratios of remission current to injection current $I_s/I_p$ and $I_b/I_p$, denoted $\alpha$, $\beta$ are a function of the primary beam energy $E_p$. This relationship is depicted in FIG. 2 for a typical metal. For substrate testing it is advantageous to choose $E_p$ so that $\delta = \alpha + \beta > 1$ for the substrate conductor material. (Suitable values of $E_p$ will typically be between 400 eV and 2000 eV.) The advantage of the regime where $\delta > 1$ derives from the fact that in this case the charging process is self-limiting in the sense that prolonged irradiation drives the irradiated element toward an equilibrium potential, $V_{eq}$, where absorbed and emitted currents balance. This balance is achieved when the potential of the irradiated element is such that enough secondary electrons SE 112 and 113 are returned to the element by the local electric field so that the net charging current is zero.

2. The Induced Current Signal for an Isolated Spherical Conductor

Figure 3:
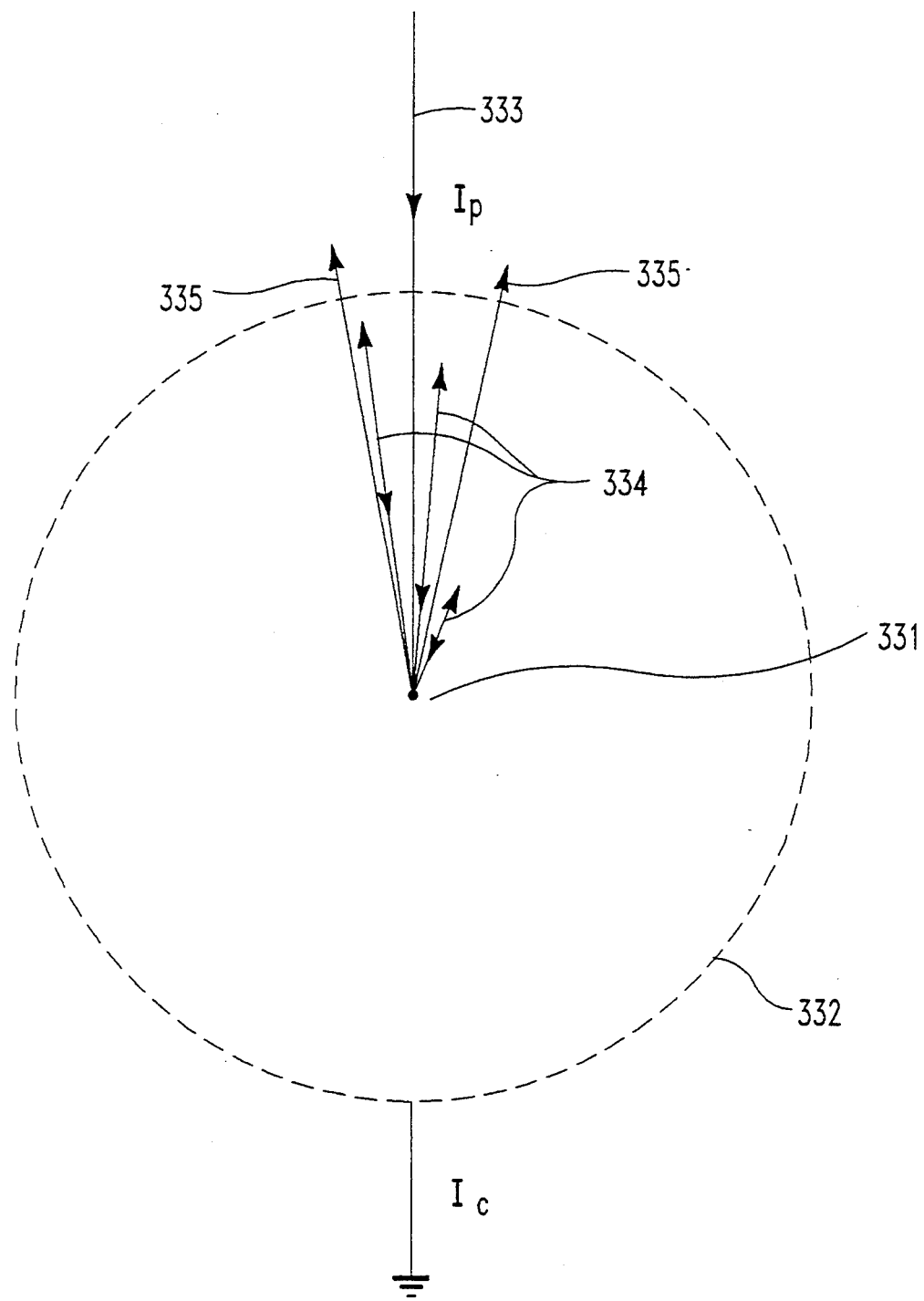
FIG. 3 shows a simple geometrical arrangement used to illustrate basic charging phenomena relevant to the invention. The arrangement consists of an electrically isolated spherical conductor within and concentric to a larger grounded conducting sphere, the larger sphere constructed of mesh so as to be effectively transparent to electrons. Radial trajectories of SE of various energies are also illustrated.

For the idealized geometric situation depicted in FIG. 3, formulae can be derived which illustrate the details of the charging process and the corresponding induced current signal. In FIG. 3, an electrically isolated spherical conductor 331 is concentric with and surrounded by a larger spherical enclosure 332. The enclosure 332 is constructed of a fine conductive mesh so as to be effectively transparent to electrons. The interior sphere 331 is irradiated by a primary beam 333 entering from above. The spherical symmetry of the example simplifies calculations since the trajectories of the SE 334 and 335 are radial and whether a SE escapes or is returned to the inner sphere 331 depends only on its initial kinetic energy. Energetic SE 335 escape the outer sphere 332 while less energetic SE 334 are returned to the inner sphere 331.

For this situation simple formulae can be derived to show the essential charging phenomena. The formulae are derived in Appendix A, illustrated in FIGS. 4A–4E, and explained below.

First consider the equilibrium potential reached by the inner sphere 331 under prolonged irradiation assuming the outer sphere 332 is at ground potential. For a given primary beam energy, $V_{eq}$ is a function only of the electron re-emission properties of the material of the inner sphere 331, i.e. $\alpha$, $\beta$, and $\Phi$, the material work function. $V_{eq}$ versus $\alpha$ as calculated by the formula of Appendix A is plotted in FIG. 4A. As can be seen from FIG. 4A, $V_{eq}$ is typically in the range from $+1$ to $+7$ volts.

Consider the charging current $I_c$ of the floating conductor as it is driven to $V_{eq}$. The characteristic features of $I_c$ are important because $I_c$ also flows in the connection from the external sphere to ground, and is therefore detectable and useful for testing purposes. To emphasize this point, consider the following experiment with the arrangement of FIG. 3. Suppose that both spheres are initially uncharged, i.e. at ground potential. Let the interior sphere 331 then be irradiated for a time, t, while the exterior sphere 332 is grounded. The interior sphere 331 will have acquired a certain charge q during the time t. Application of Gauss's law to a surface outside the larger sphere 332 requires however that the Gaussian surface enclose no charge since there is no field exterior to the large sphere. Clearly an equal and opposite charge $-q$ must have flowed from ground to the external sphere. Since the time t considered was arbitrary it follows that the current flowing in the ground connection has to be of a magnitude and direction to instantaneously offset the net charging current of the floating conductor. A current equal in magnitude, of opposite sign and flowing in the opposite direction, is identical to the charging current. The argument above is equally valid if the exterior sphere 332 is maintained at a potential other than ground.

For the arrangement of FIG. 3, formulae can also be derived for $I_c$ as a function of V, the potential of the floating sphere. This relationship is graphed in FIG. 4B, where the external sphere is assumed to be at ground potential. If the initial potential of the inner sphere 331, $V_i$, is $<0$, all SE emitted flow thru the outer sphere 332. So long as $V_i<0$, $I_c$ is a constant positive current, $I_{SAT}=(\alpha+\beta-1)I_p$. The loss of electrons by the inner sphere 331 will however increase it's potential. As the potential becomes positive, $I_c$ decreases since some SE are returned to the inner sphere 331 by the retarding field. The process continues until $I_c=0$, $V=V_{eq}$. On the other hand if the initial potential $V_i>V_{eq}$, the retarding field will return enough SE to the inner sphere 331 so that $I_c$ will be negative. The negative current will decrease the sphere potential which in turn reduces the current, etc. Equilibrium is again achieved when $V_{eq}$ is attained. The characteristic shape of the I(V) curve is a result of the energy distribution of the SE electrons. (See Appendix A).

Figure 4A:
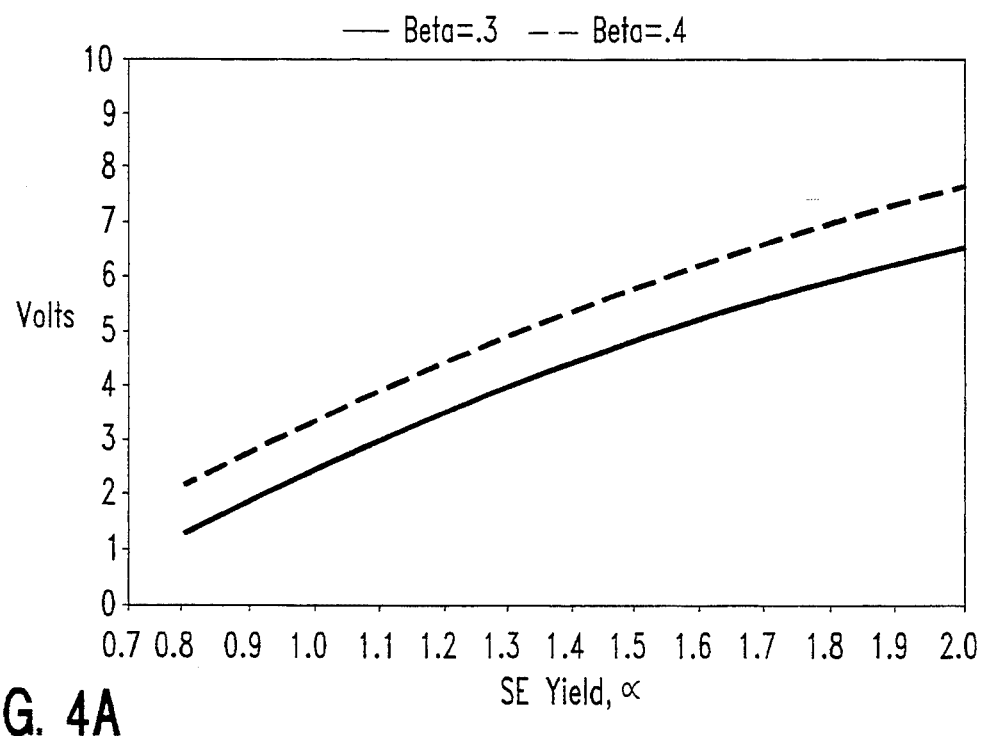
FIGS. 4A–4E illustrate the characteristic features of conductor charging for the arrangement of FIG. 3.

$I_c$, the induced current signal detectable in the connection to the outer sphere 332 varies as a function of time. The ratio $I_c(t)/I_p$ depends on the capacitance of the inner sphere 331, $V_i$, $\alpha$, $\beta$, and $\Phi$. Numerical calculations of $I_c(t)$ are described in Appendix A. FIG. 4C illustrates the calculated ratio $I_c(t)/I_p$ as a function of time for several initial potentials of the floating conductor ranging from $-5$ V to $+20$ V.

Figure 4B:
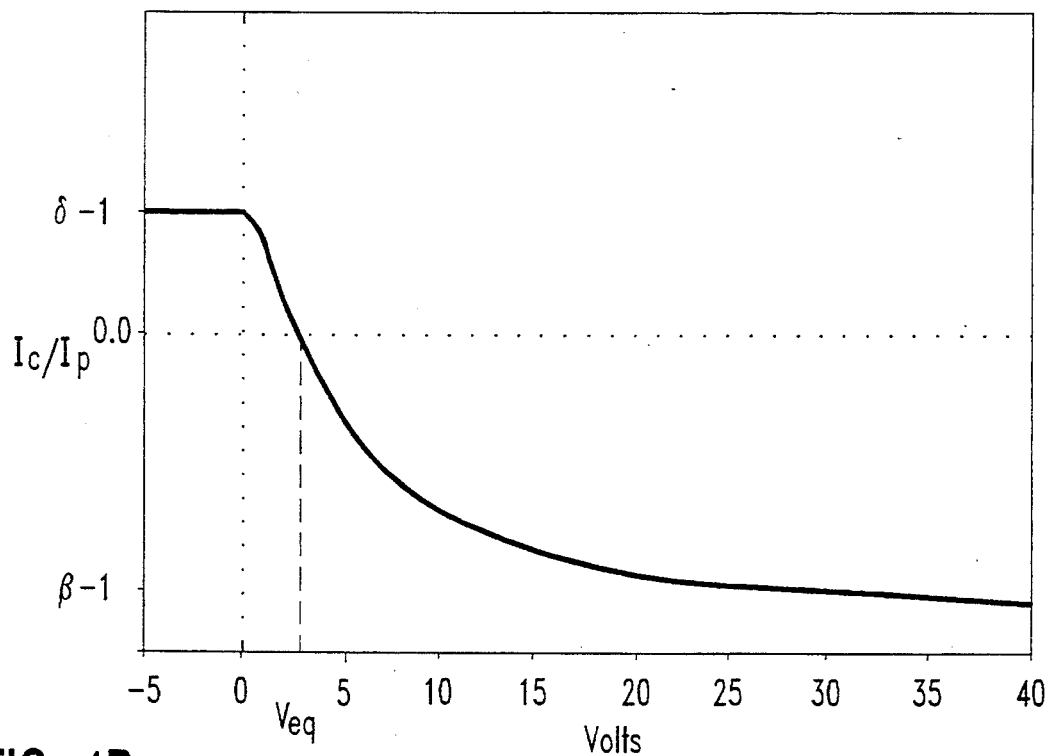
Figure 4C:
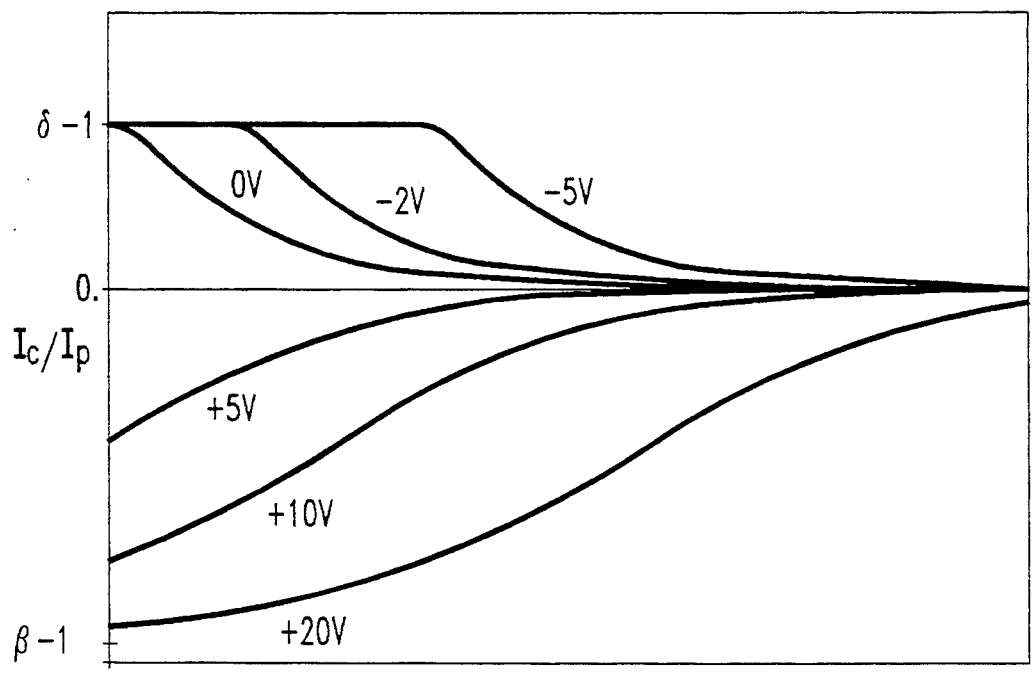
Figure 4D:
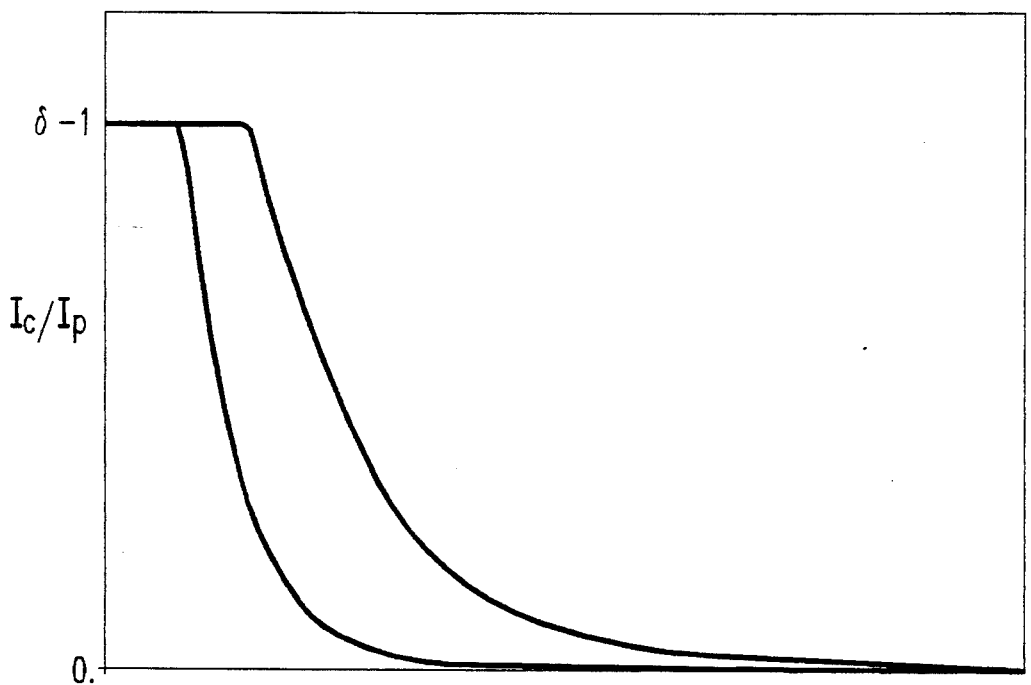

FIG. 4D illustrates the effect on $I_c(t)$ of different values of capacitance for two inner spheres all other variables being fixed.

Figure 4E:
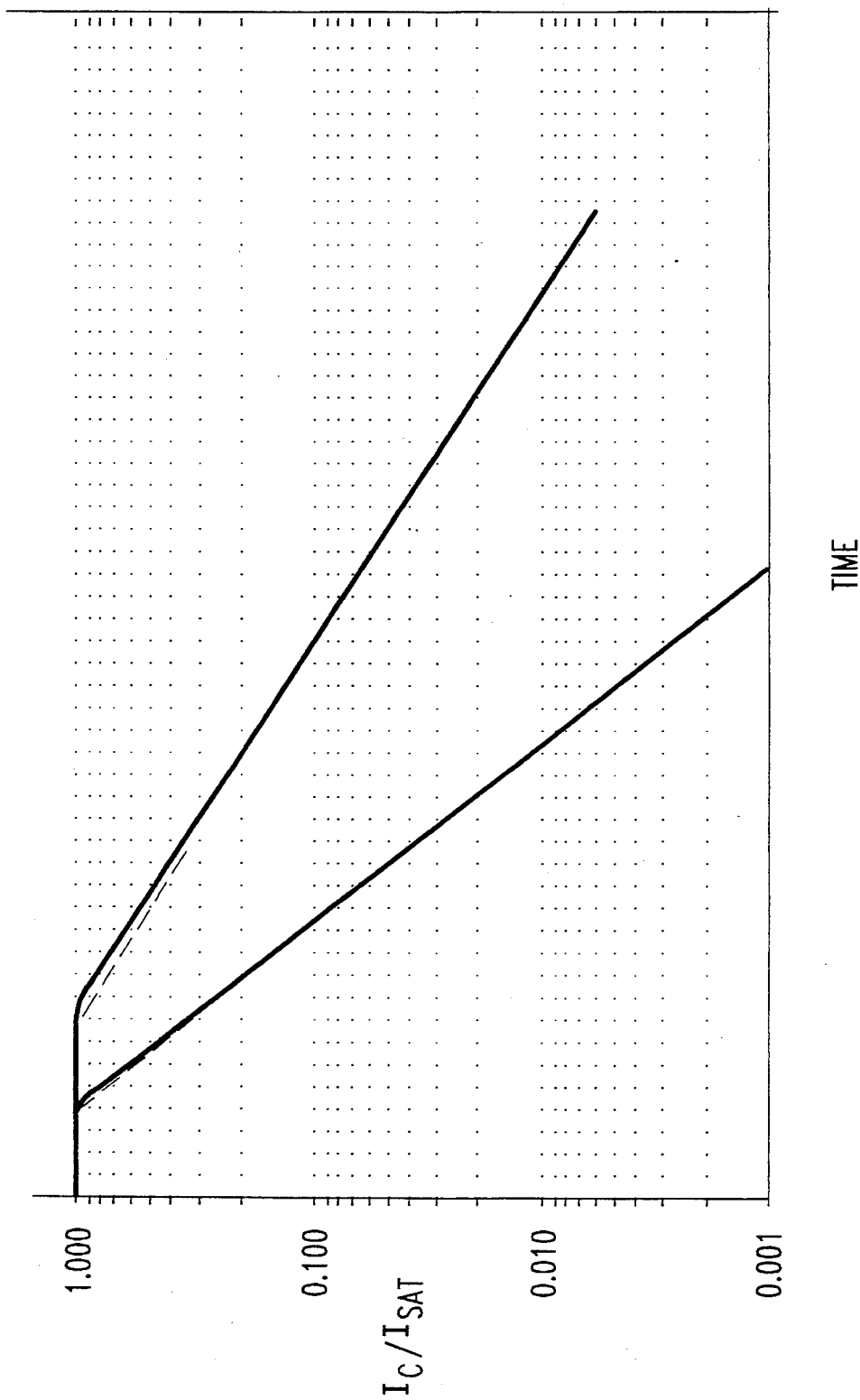

FIG. 4E illustrates the data of FIG. 4D replotted on a semi-logarithmic scale. The data have been divided by the initial saturated signal value $I_{SAT}$. Notice that for $I_c/I_{SAT}<0.3$, the data fit a straight line.

3. Induced Current Signal for Conductors on a Planar Substrate

Consider next the detection of induced current signals in the context of substrate testing.

Figure 5A:
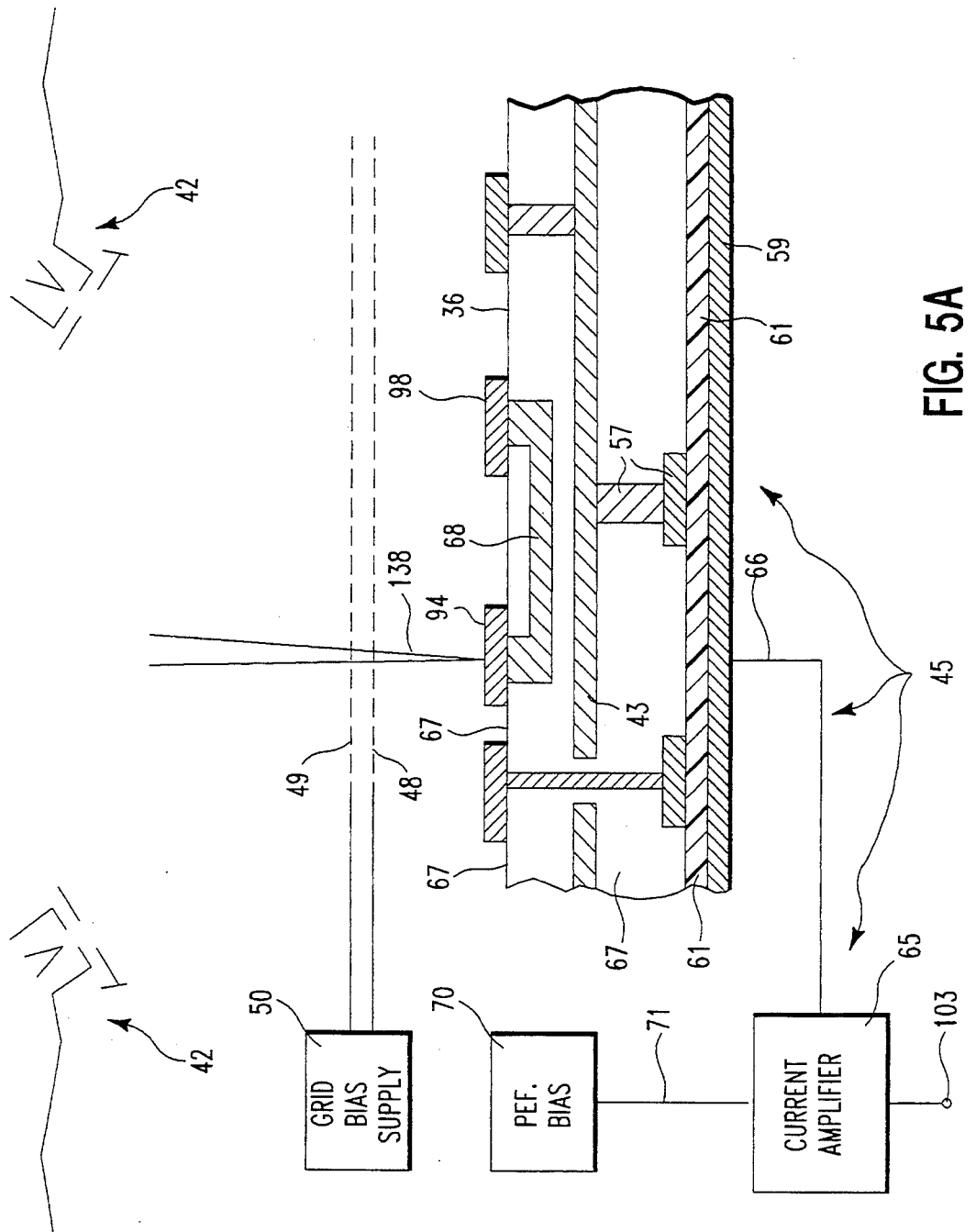
FIG. 5A shows the arrangement for detecting the induced current signal, where contact is made to a conducting structure external to but in close proximity to the substrate. Optionally, a thin insulating spacer of high dielectric constant material may be interposed between the substrate and the conducting structure.

FIG. 5A illustrates a planar substrate 36 which contains conducting networks isolated from each other and from any other conductor by insulating material 67. If a conductor network is irradiated by a primary electron beam 138 impinging on a top surface node 94 or 98, the network will be charged by the beam. If a planar conductive structure 59 is in close proximity to the bottom surface of the substrate 36 and contacted, then a charging current signal will flow in the contact 66 to the conducting structure 59 when the potential of a substrate network is changed by irradiation with an electron beam 138. For example electron beam 138 charges conductor 68 via nodes 94 and 98 which lie on top of substrate 36 and each of which is connected to conductor 68. If there are no other non-floating conductors in the vicinity of the substrate 36, the entire charging current flow is in the connection 66 to the contacted conducting structure 59, just as in the case of the spherical conductors in FIG. 3. As a practical matter it is easy to arrange that essentially all the induced current flow is in the connection 66 by arranging that the capacitance between network 68 and the conducting structure 59 is larger than that between the network 68 and any other non-floating conductor, e.g. the metallic grid 48. This can be accomplished by inserting a thin insulating spacer of high dielectric constant insulation material 61 between the substrate 36 and the conducting structure 59.

If the primary beam energy is chosen so that $\delta>1$, the primary beam 138 will drive the node 94 towards an equilibrium potential where electron reemission and absorption balance and charging current ceases to flow.

The equilibrium potential of an irradiated conductor on a planar substrate will be strongly influenced by the electric field in the vicinity of the node. A grid 48, which is effectively transparent to the primary beam 138, is provided above and parallel to the top surface of substrate 36, and grid 48 is connected to a variable voltage supply 50.

The variable voltage supply, responsive to a system controller applies either a negative, zero or a positive potential to the grid 48 as explained in more detail below.

The potential applied to that grid 48 and the bias potential applied to the conducting structure 59 wall strongly affect the electric field near substrate conductors 68. The electric field in turn affects the equilibrium potential of a node. The test methods of the present invention exploit the influence of the grid 48 and conducting structure 59 on the charging process.

Optionally a second grid 49, effectively transparent to the primary beam 138 is provided above and parallel to the first grid 48 and connected to a fixed bias supply from bias supply unit 50. Grid 49 screens the primary beam from the variable potential of grid 48.

As previously mentioned the primary beam energy, $E_p$, must be chosen so that $\delta>1$ for the conductor. It is highly desirable to choose $E_p$ so that $\delta>1$ for the insulator as well, so that insulator charging processes are also self-limited and controllable by the grid potential.

Figure 6:
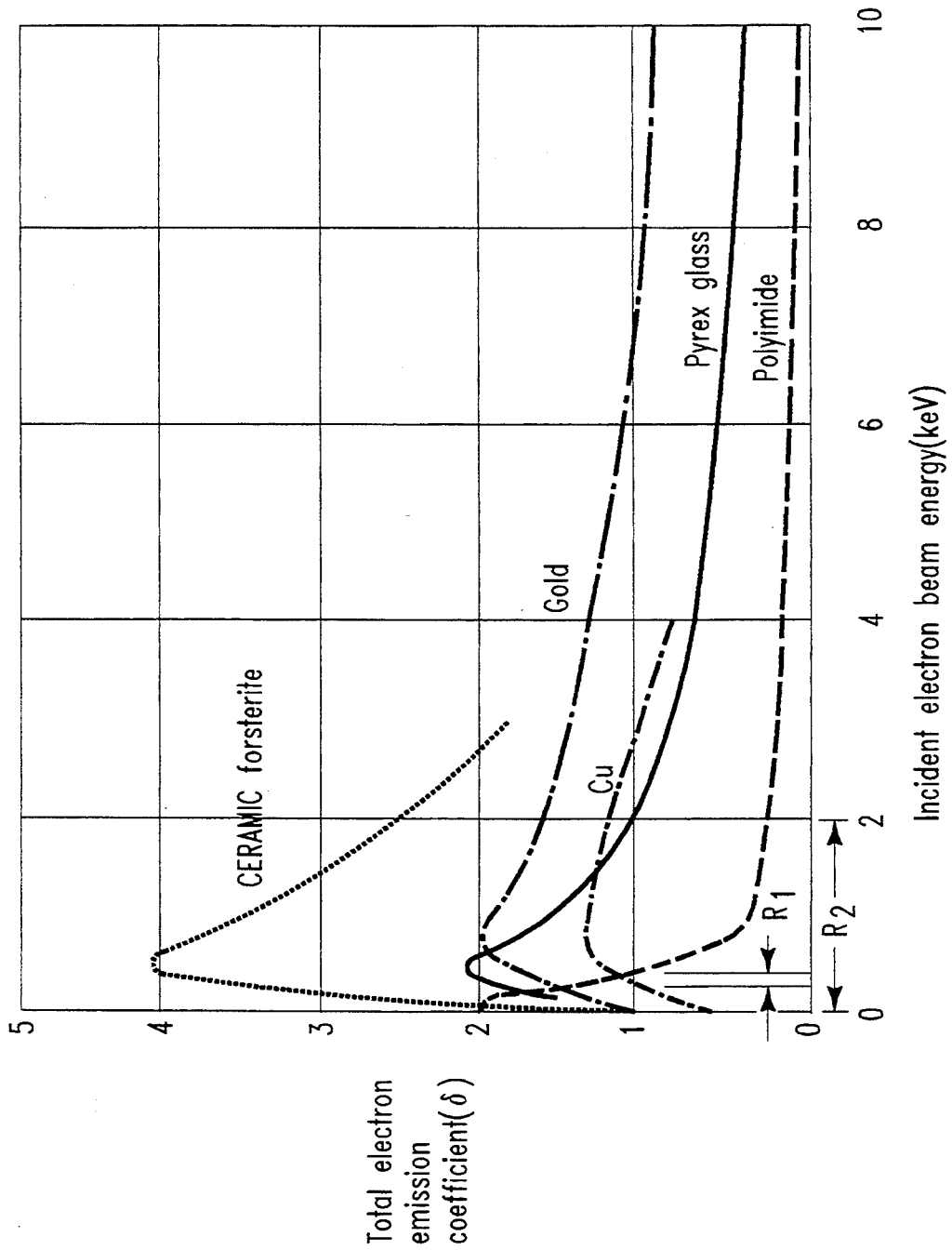
FIG. 6, adapted from the Lee et al reference above, illustrates the total electron emission yield, $\delta$, as a function of primary beam energy $E_p$, for several conductors and insulators. Ranges of $E_p$ such that $\delta > 1$ for both insulator and conductor are indicated for the case of Cu/Polyimide, R1, and for the case of Gold/pyrex glass, R2.

FIG. 6, based on a figure from Lee et al, supra, illustrates the total electron emission coefficient $\delta$ versus $E_p$ for several insulators and conductors. As illustrated in FIG. 6 for Cu and polyimide, a beam energy in the range of 400 to 600 eVolts is appropriate. For an insulator like Pyrex glass, the preferred range is from 400 to 2000 eVolts.

4. Test System Hardware

Figure 7:
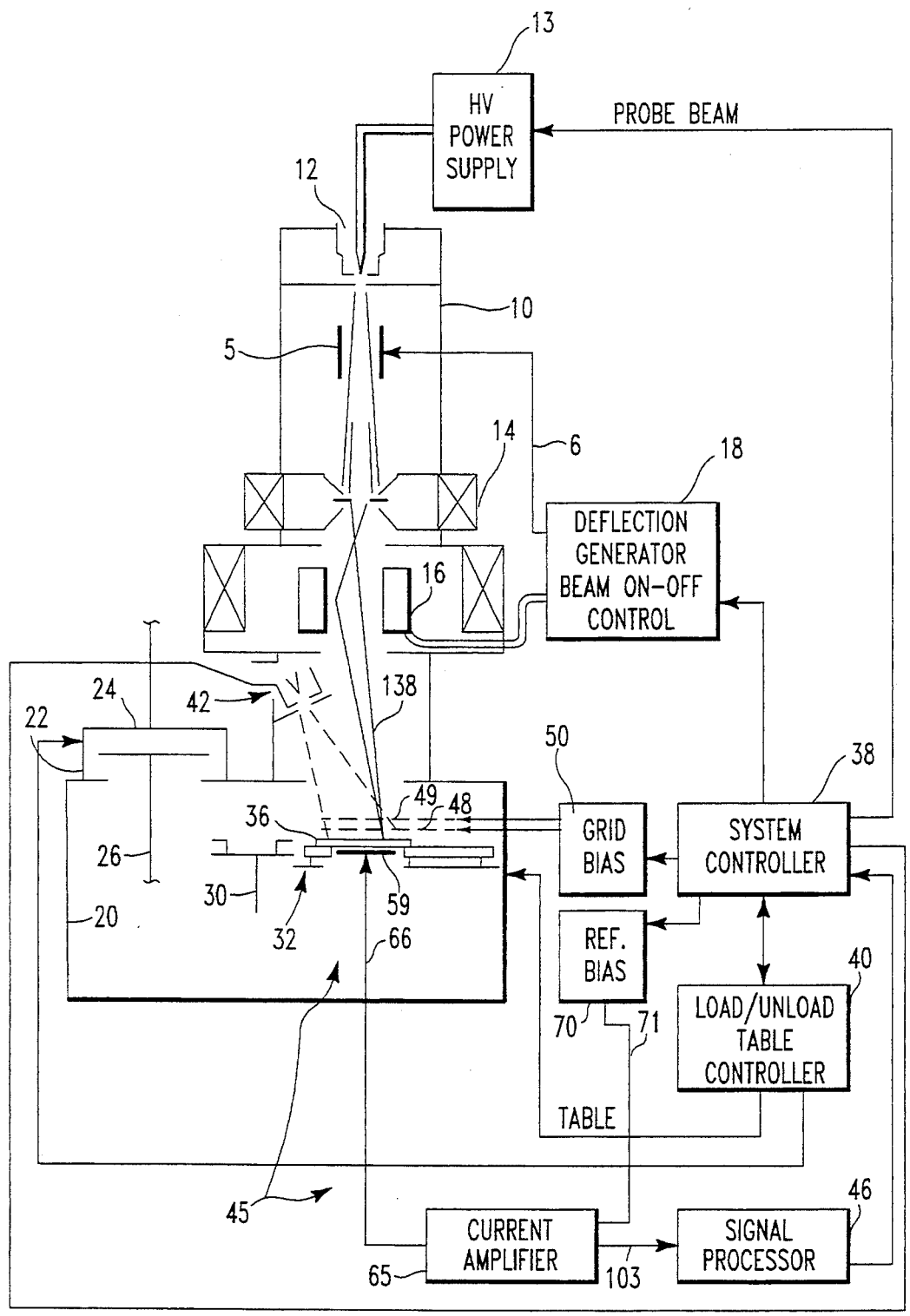
FIG. 7 shows a block diagram of a complete test system incorporating the present invention.
Figure 8:
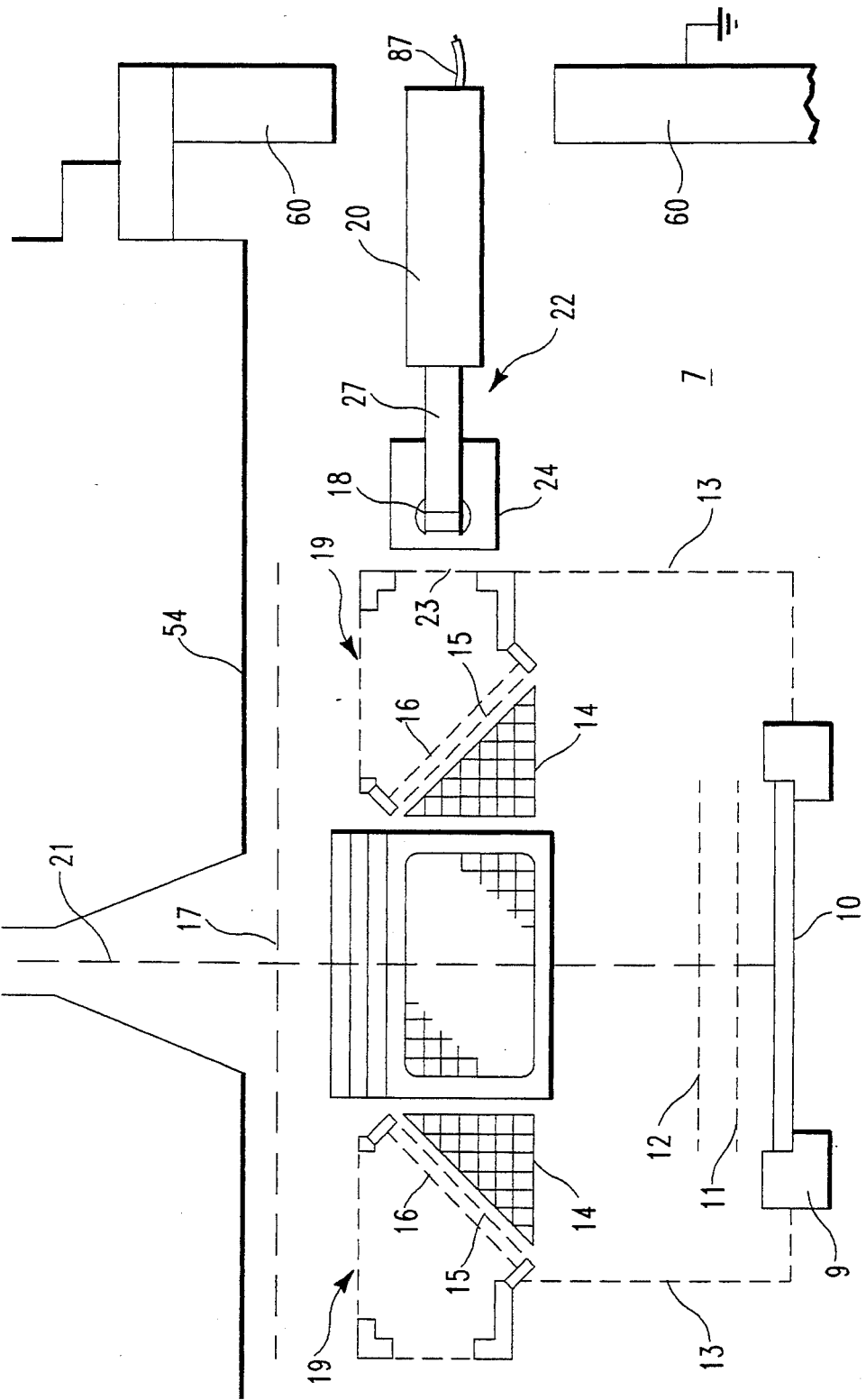
FIG. 8 illustrates a voltage contrast secondary electron detector from a prior art test system.

Referring now to FIG. 7, the architecture of a preferred embodiment of a basic system including the present invention is shown. The overall architecture of this system is similar to the system shown and described in U.S. Pat. No. 4,843,330, assigned to the assignee of this invention.

An electron beam vacuum column 10 has an electron beam probe gun 12 shown disposed at the upper end thereof. A high voltage power supply 13 provides a selectable accelerating potential to gun 12. A focusing lens system 14 comprising annular coils is used to focus the beam emanating from probe gun 12. Deflection coils 16, driven by a deflection generator 18, are used for beam steering of electron beam 138. Additional focus and deflection coils (not shown) may be employed as required, depending upon the size of the field to be scanned. The electron optics are similar to those of scanning electron microscope systems known in the art.

A processing vacuum chamber 20 has a load lock 22 with a lock port 24 to automatically handle specimens to be tested. A loading mechanism 26 is used to receive specimens that are mounted on carriers at load lock 22 and move them to transfer table 30. By means of mechanical pushers, air techniques and the like, specimens are moved from the transfer table 30 onto the specimen table 32. The table 32 is selectively movable in the X-Y directions perpendicular to the axis of beam 138 to position the specimen within the beam deflection field. The specimens, once testing is complete, are then transferred in a reverse manner back to the load lock 22 such that when lock port 24 is raised, those specimens previously tested are removed from the chamber 20 and new specimens to be tested are introduced. Loading, unloading and table movement are controlled by a system controller 38 which provides instructions to a specimen handling controller 40. Electronic control of transfer movement and port access in a manner coordinated with the overall test procedure is well known in this technology. Such techniques are also well known in semiconductor lithography. The specific aspects of the hardware of system controller 38 (which is a general purpose computer) and controller 40 form no part of the present invention.

The system includes an upper flood gun 42 or flood guns 42 which are selectively activated in a manner to be described herein, in order to charge the top surface of the specimen substrate 36 during various test procedures.

Mounted above and in a plane substantially parallel to the top surface of specimen 36 is a conductive grid 48. The grid 48 is connected to a grid bias generator 50 which, responsive to system controller 38, applies either a negative, a zero or a positive potential to grid 48 as will be explained in more detail herein.

Optionally a second grid 49 parallel to grid 48, also connected to grid bias generator 50, may be included. The upper grid 49 is held at a moderate fixed bias potential thereby reducing or eliminating the effect on the primary beam 138 of the lower grid bias.

In operation, input data is supplied to the system controller 38 providing the addresses of the test points on the specimen to be tested and the expected outputs for those test points if the specimen has no defects. Controller 38 provides signals to the deflection generator and beam on-off control 18 in order to control the exposure (on-off) and the deflection of the probe beam. Control 18 is connected by line 6 to blanking plates 5. Such controller functions are well known in the electron beam lithography art.

Disposed within column 10 is an induced current detector 45 described below. An induced current signal is produced as the result of irradiation of a specimen by the probe beam 138 from gun 12; and the induced current signal is detected by detector 45 which provides an output signal to processor 46. Signal processor 46 performs a function of filtering the signal, converting the signal to digital form and transmitting the digital data to the system controller 38. System controller 38 analyzes the digital data in real time in one of several ways described below as test methods 1, 2, 3 and 4.

Figure 5B:
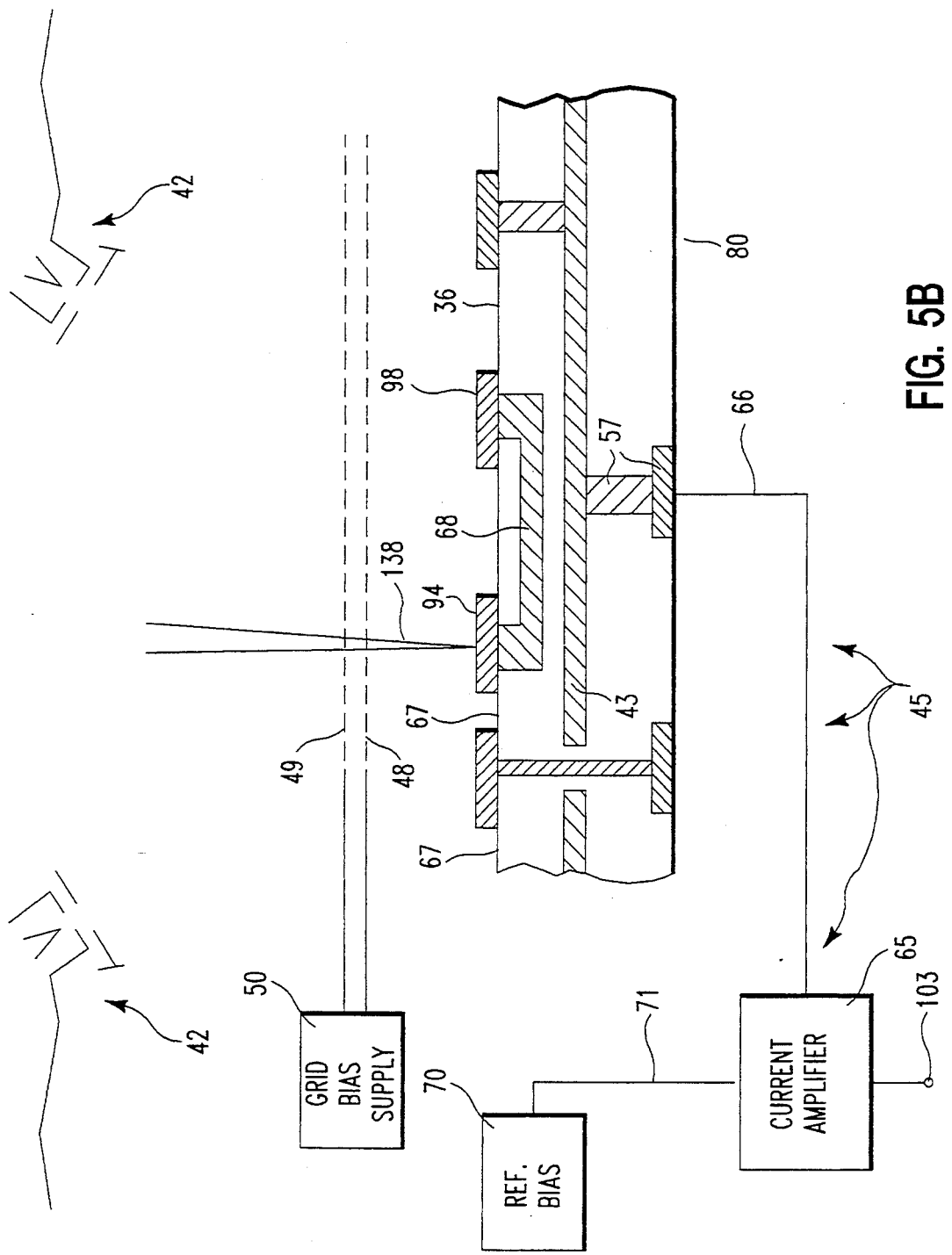
FIG. 5B shows the arrangement for detecting the induced current signal, where contact is made to a conducting structure internal to the substrate under test.

Referring to FIGS. 5A and 5B, an induced current detector 45 shown therein consists of an internal conductive structure 43 or an external conductive structure 59 connected by line 66 to current amplifier 65. A substrate 36 of an insulating material 67 such as a ceramic typically has a electrically conductive plane 43 buried within i.e. inside the insulating material 67. In practice the conductive structure 43 need not be planar and it may have connections to the top and bottom surfaces of the substrate 36. The structure 43 may be only partially metallized so that other conductive paths pass through it to carry signal or power. The essential characteristic required of the contacted structure 43 to make it suitable as the detector for induced current is that the networks to be tested have a stronger capacitive coupling to the contacted structure 43 than to any other non-floating conductor in the substrate environment. The line 68 is a conductor connecting nodes 94 and 98, the interconnected nodes constituting a "network" for the purposes of this invention. Physical and electrical contact is made by electrical contact 57 to either the conducting structure 43 internal to the substrate (FIG. 5B) or to an external conducting structure 59 as shown in FIG. 5A which is brought into close proximity to the bottom surface of the insulating material 67 of substrate 36 (FIG. 5B). The electrical contact 57 is in turn connected to a current amplifier 65. The current amplifier 65 is constructed by known methods to maintain a constant potential at its input connection 66 and to produce an output voltage at terminal 103 proportional to the current flowing in the input connection 66. If the internal conducting structure 43 (or external conducting structure 59) is maintained at a constant potential by connection to the current amplifier 65, and if the potential of a network is then changed by the action of an electron beam 138, the current amplifier 65 must supply current to the conducting structure 43, 59 to maintain its constant potential. The current amplifier 65 can be constructed by known methods so that the constant potential maintained at the connection 66 can be at 0 Volts or at some other potential, determined by an additional voltage supply 70 connected to amplifier 65 by line 71. The current supplied by the current amplifier 65 is called the "induced current".

5. Substrate Test Data

We will call the specific conductor features to be tested by the E-beam system "nodes" 94, 98. A network 68 consists of a set of electrically interconnected nodes. A list of all networks to be tested, including a sub-list of all the nodes within a network is provided to the test system control unit. In this net-list the position of each node on the substrate is specified with respect to an agreed upon co-ordinate system. Optionally, depending on the test method, for each network, the capacitance of the net relative to the conducting structure is specified. If the tester does not have full substrate deflection capability, the substrate 36 is moved by table 32 to a number of different test positions so that all nodes to be tested can be addressed by the electron beam 138. The specific test positions are determined in advance so that complete test coverage is obtained. The test positions are arranged in a sequence to minimize table movement, e.g. boustrophedontic sequence. Corresponding to each test position, there is a net list containing the substrate net and node information.

6. Tester System Output

The output of the test system is information about the electrical integrity of the wiring networks. This output information consists of four reports. The Opens List reports all nets with opens and the nodes found open. The Shorts List reports all short defects and at least one of the nets involved in each short is listed. Complete information about shorts is contained in an optional third report which is produced after additional testing. The Shorts Identification report identifies all nets involved in each of the detected shorts. Optionally, a fourth report, the Net Capacitance report, consisting of a list of all nets and/or nodes along with their measured capacitances is produced.

7. Test Procedures

Four test methods will be described, each with advantages and disadvantages depending on the particulars of the application. Test method 1 implements a charge storage test method similar to methods known from the literature but using the induced current signal instead of a secondary electron voltage contrast signal. Test methods 2, 3, and 4, are all based on measurement of network capacitance but differ in the way in which the induced current signal is evoked and analyzed. The four methods have in common that they employ a global charging procedure to establish an initial equilibrium potential distribution on the part. Next the lower grid bias and/or the conducting structure potential is changed. Because of this change the substrate nodes will no longer be at their equilibrium potential. The actual defect detection is then accomplished by a sequence of steps involving directing the focussed probe beam to the nodes to be tested and interpreting the induced current signal obtained when the beam is unblanked on the test node.

7.1 Global Charging Procedure

An initial equilibrium potential is established on all the networks of a substrate by irradiation with one or more flood guns, or by scanning the focussed probe beam, with a bias potential applied to the lower extraction grid, $V_{GRID-GLOBAL}$, and optionally a bias applied to the contacted conducting structure, $V_{COND-GLOBAL}$. The beam energy of the flood beam is chosen by the same criteria used for the primary beam, i.e, so that $\delta > 1$ for all the conductors and insulators. The initial potential can be established more quickly and uniformly with one or more flood guns 42, than by primary beam scanning since multiple guns with higher beam currents and broad area coverage can be used. The flood gun irradiation must be continued for as long as necessary to drive all nodes to their equilibrium potentials. This time will typically be a few milliseconds with commercially available floodguns. Some variation in node equilibrium potentials is to be expected, since different nodes may see different local electrical environments. If the contacted conducting structure used by induced current detector 45 has connections to the top surface of the substrate 36, then proximity of a node to conducting structure nodes and the bias on the conducting structure will influence node equilibrium potentials. These variations among nodes cause no problems for open/short defect detection since the global charging procedure including $V_{GRID-GLOBAL}$, and $V_{COND-GLOBAL}$ is standardized and repeatable, and the test method involves comparisons between substrates. For more accurate node capacitance measurements these effects can be reduced by proper analysis of the induced current signal and proper choice of the conducting structure bias potential as described below under test method 3 and test method 4.

7.2 Test Method 1

Charge Storage Test Method Using Induced Current Signal

The first test method of the present invention is closely related to prior art voltage contrast systems employing charge storage test methods. The test method is most useful if the test system has full substrate deflection capability and will be described for this case. The voltage contrast detector of prior art test systems is however replaced by the induced current detector. The amplitude and polarity of the induced current signal detected when the primary beam is unblanked on a node will depend on the relationship of the node potential to its equilibrium potential. All nodes are equilibrated initially by the global charging process with lower grid bias $V_{GRID-GLOBAL}$. The lower grid bias is then changed to a different potential $V_{GRID-LOCAL}$. The change in grid bias changes the node equilibrium potential. Consequently when nodes are subsequently addressed by the primary beam an induced current signal will be detected. Prolonged irradiation of a node will drive it toward its new equilibrium potential, with a corresponding decline in the induced current signal. The only requirements on $V_{GRID-GLOBAL}$ and $V_{GRID-LOCAL}$ are that they be sufficiently different to produce a detectable induced current signal during Step 3 below, and that $V_{GRID-LOCAL}$ is not so large as to cause deleterious primary beam deflection or spot size degradation.

OPENS AND SHORTS DEFECT DETECTION

Figure 9A:
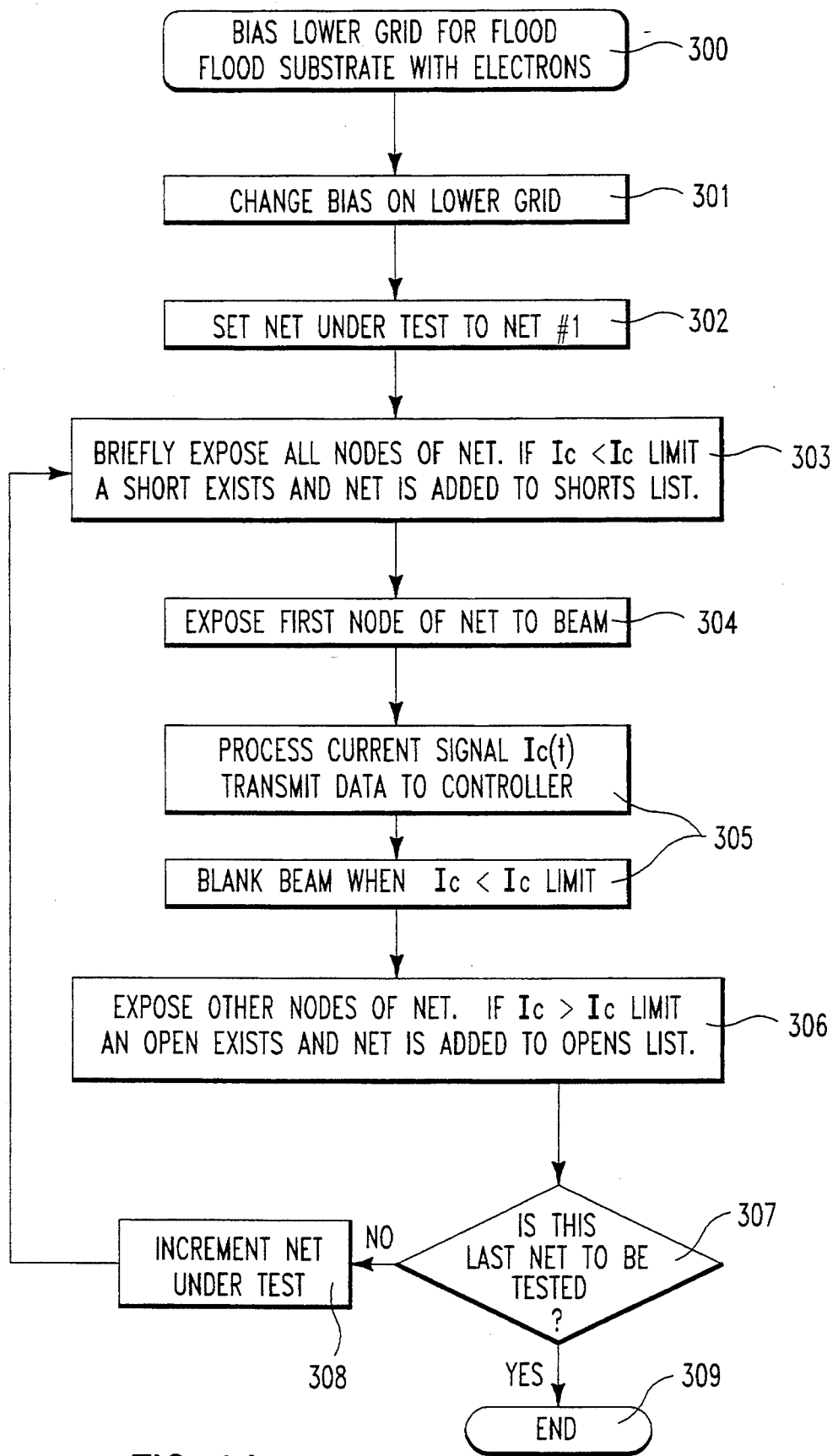
FIG. 9A is a flow chart of the opens and shorts defect detection procedure of Test Method 1.

The first step in Test Method 1 is a basic procedure to detect all open and short defects. This basic procedure will detect all shorts but may not find all nets and nodes involved in each short. Complete delineation of all nodes and nets involved in shorts is deferred to an optional additional test procedure to be described later. The basic opens and shorts defect detection procedure is illustrated in FIG. 9A and is described as follows:

Step 1: Global Charging. (FIG. 9A, 300)
The grid 48 is biased to voltage $V_{GRID-GLOBAL}$. The substrate 36 is flood irradiated by electron guns 42, or by raster scanning primary beam 138.

Step 2: (FIG. 9A, 301)
The potential on the lower grid 48 is biased to $V_{GRID-LOCAL}$.

Step 3: (FIG. 9A, 302)
The variable, NET UNDER TEST, is set to Net #1 of the Net List.

Step 4: (FIG. 9A, 303)
The focused probe beam 138 is directed in turn to each of the nodes of the NET UNDER TEST and briefly unblanked on each. If the amplitude of the induced current signal of any node is less than the predetermined value, i.e., $I_c < I_c$ LIMIT, a short exists and the NET UNDER TEST is added to the Shorts List.

Step 5: (FIG. 9A, 304 )
The focused probe beam is directed to the first node of the NET UNDER TEST and unblanked.

Step 6: (FIG. 9A, 305)
Beam unblanking is terminated when the induced current signal has declined to a value less than a predetermined value, i. e., $I_c < I_c$ LIMIT.

Step 7: (FIG. 9A, 306)
The focused probe beam is directed in turn to each of the remaining nodes of the NET UNDER TEST and briefly unblanked on each. If the amplitude of the induced current signal of any node is greater than a predetermined value, i. e., $I_c > I_c$ LIMIT, an open exists and the Node # and NET UNDER TEST # are added to the Opens List.

Step 8: Is the NET UNDER TEST the last net to be tested?
If NO, increment NET UNDER TEST (FIG. 9A, 308) and go to Step 4. (FIG. 9A, 303)

If YES, Opens and Shorts Defect Detection Test is complete. (FIG. 9A, 309)

Figure 9B:
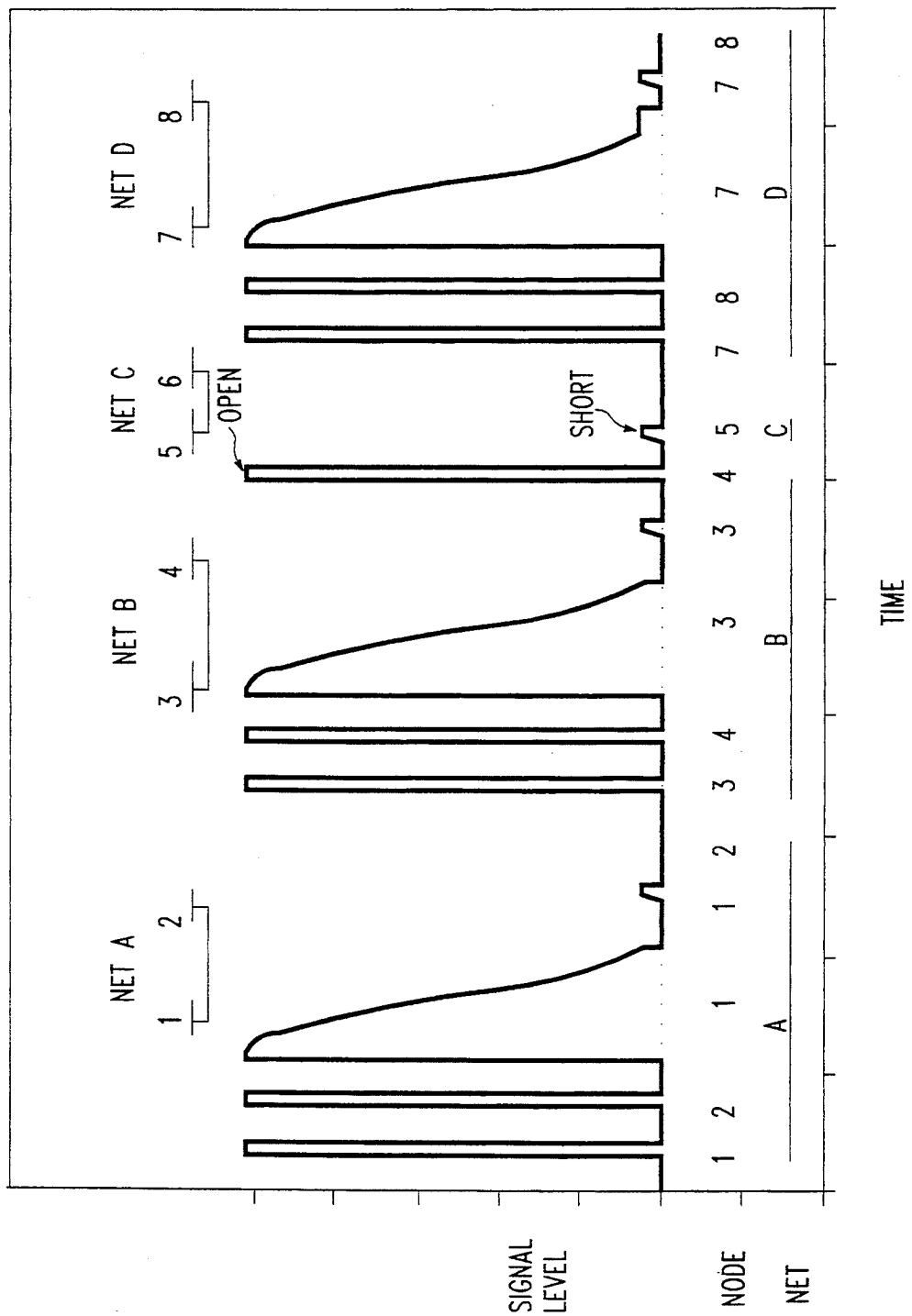
FIG. 9B illustrates the induced current signal during the test of four networks according to Test Method 1 of the invention.

As an example, FIG. 9B illustrates the induced current signal as it would appear during the open and short defect detection testing of a substrate with four nets each containing 2 nodes. For purposes of illustration it is assumed that $V_{GRID-LOCAL} > V_{GRID-GLOBAL}$. In this case the induced current signal is positive. An open defect is assumed to exist between nodes 3 and 4 of net B and Net C is shorted to Net A or Net B.

While the test sequence has been described to detect both opens and shorts, a simplified sequence to perform only an opens test could omit step 4. A simplified sequence to perform only a shorts test could omit step 7.

SHORTS DELINEATION TEST

The second step in Test Method 1, the Shorts Delineation Test, is optional and is performed only if complete information about all nodes involved in shorts is desired. Inputs to the Shorts Delineation Test are the Opens List and Shorts List from the Opens and Shorts Defect Detection Test described above. The output of the Shorts Delineation Test is a Final Shorts Report.

Figure 9C:
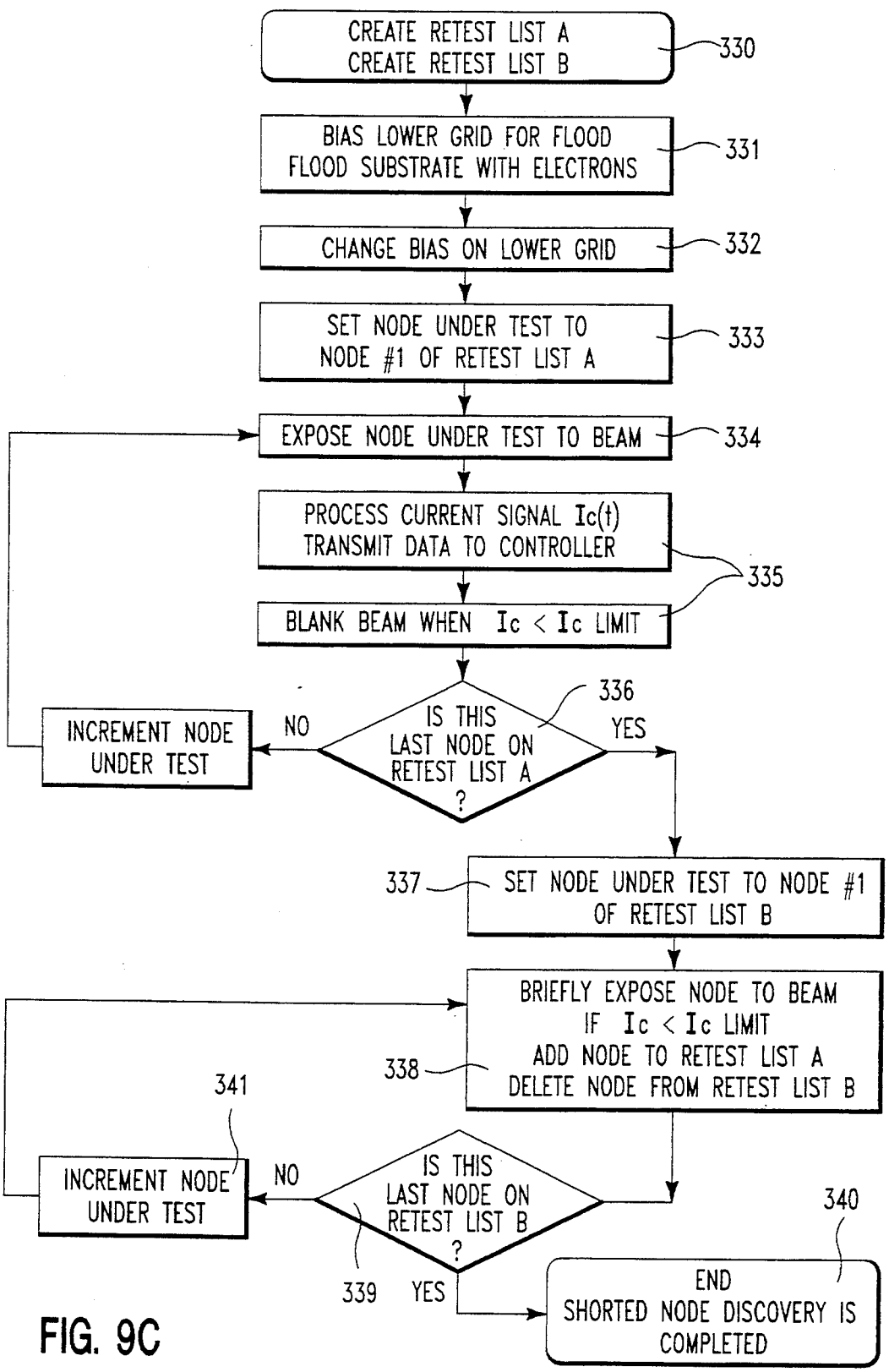
FIG. 9C is a flow chart of the procedure for discovering additional shorted nodes for Test Method 1.
Figure 9D:
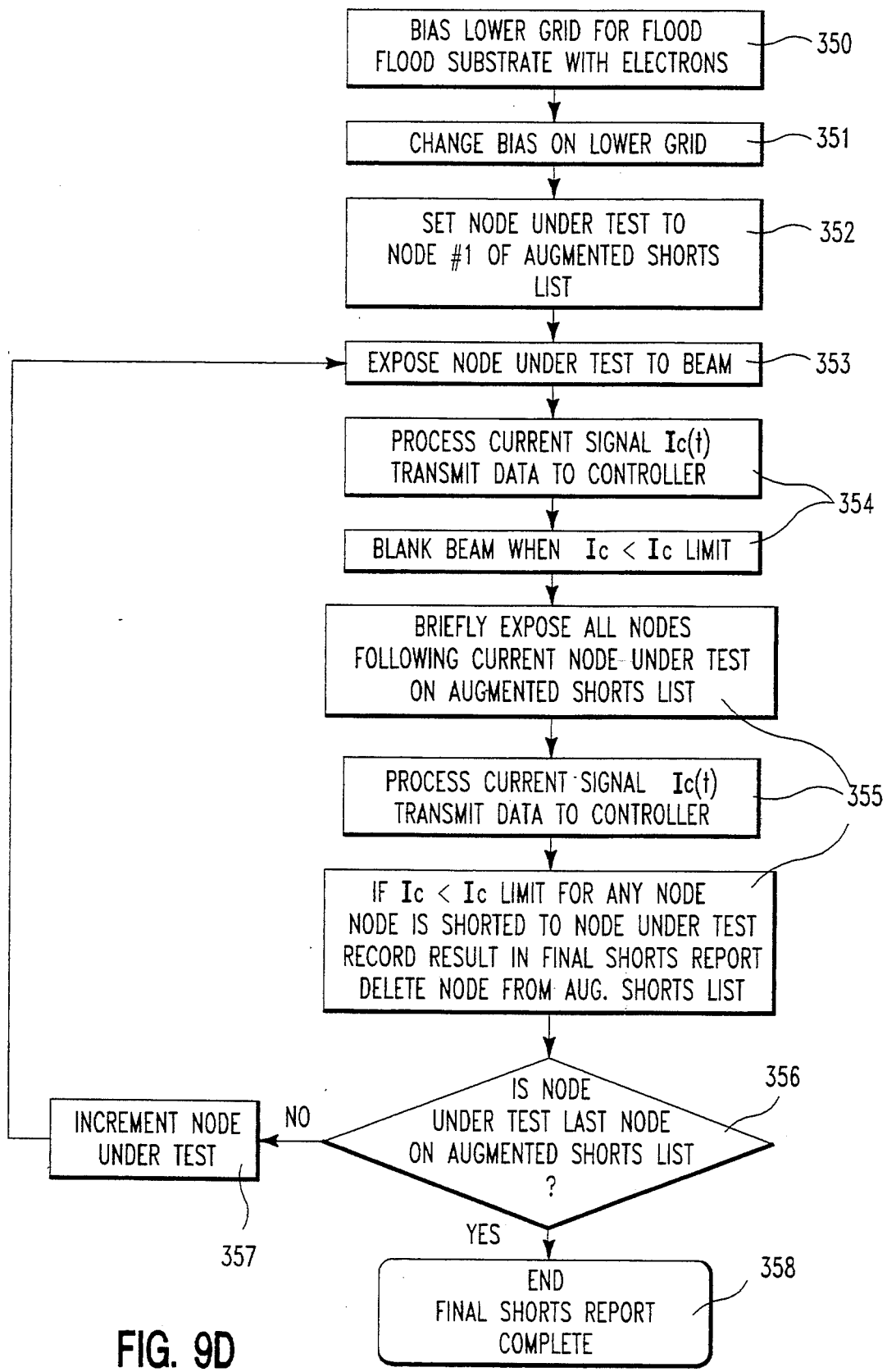
FIG. 9D is a flow chart of the shorts pairing procedures of Test Method 1.

The Shorts Delineation Test consists of two parts which are shown in FIG. 9C and FIG. 9D and described below. The first part of the Shorts Delineation Test discovers additional shorted nodes and nets and produces the Augmented Shorts List; the second part, the Shorts Pairing, uses the Augmented Shorts List to delineate all nets or nodes involved in each short and produces the Final Shorts Report.

For the descriptions which follow it is assumed that the test system has full substrate deflection capability.

ADDITIONAL SHORTED NODE DISCOVERY

This procedure is illustrated in FIG. 9C and is described in detail as follows:

Step 1: (FIG. 9C, 330)
A list called the Retest List A is compiled from the Shorts List and Opens List. The Retest List A contains one node from each net on the Shorts list, and all nodes from all nets on the Opens List. A second list called Retest List B is compiled which contains one node from every net which has no nodes on Retest List A.

Step 2: (FIG. 9C, 331)
Global Charging; The grid 48 is biased to voltage $V_{GRID-GLOBAL}$. The substrate is flood irradiated by the flood guns 42, or by raster scanning primary beam 138.

Step 3: (FIG. 9C, 332)
The potential on the lower grid 48 is biased to $V_{GRID-LOCAL}$.

Step 4: (FIG. 9C, 333)
The variable NODE UNDER TEST is set to node #1 on Retest List A.

Step 5: (FIG. 9C, 334)
The focussed probe beam is directed to NODE UNDER TEST and unblanked.

Step 6: (FIG. 9C, 335)
Beam unblanking is terminated when the induced current signal has declined to a value less than a predetermined value, i.e. $I_c < I_c$ LIMIT.

Step 7: (FIG. 9C, 336)
Is NODE UNDER TEST=last node on Retest List A?

If NO set NODE UNDER TEST=next node on Retest List A and go to Step 5. (FIG. 9C, 334)
If YES go to Step 8 (FIG. 9C, 337)

Step 8: (FIG. 9C, 337)
Set NODE UNDER TEST to Node #1 on RETEST LIST B

Step 9: (FIG. 9C, 338)
The focused probe beam is directed to NODE UNDER TEST and briefly unblanked. If the amplitude of the induced current signal is less than a predetermined value, $I_c$ LIMIT, then NODE UNDER TEST is an additional shorted node. As such it is added to the Retest List A and deleted from Retest List B.

Step 10 (FIG. 9C, 339)
Is NODE UNDER TEST=last node on Retest List B?
If NO set NODE UNDER TEST=next node on Retest List B (FIG. 9C, 341) and go to Step 9. (FIG. 9C, 338)
If YES, Additional Shorted Node Discovery is complete. (FIG. 9C, 340)

Retest List A, as modified by the above procedure is the Augmented Shorts List. The Augmented Shorts List includes all nets and nodes involved in shorts. What remains is to identify all nets and nodes involved in each short. This is done by the Shorts Pairing procedure described next.

SHORTS PAIRING PROCEDURE

This final procedure completes the delineation of all nets or nodes involved in each short defect and produces the Final Shorts Report. This procedure is illustrated in FIG. 9d and is described as follows:

Step 1: (FIG. 9C, 350)
Global Charging; The grid 48 is biased to voltage $V_{GRID-GLOBAL}$. The substrate is flood irradiated by the flood guns 42, or by raster scanning primary beam 138.

Step 2: (FIG. 9C, 351)
The potential on the lower grid 48 is biased to $V_{GRID-LOCAL}$.

Step 3: (FIG. 9C, 352)
The NODE UNDER TEST is set to node #1 on the Augmented Shorts List.

Step 4: (FIG. 9C, 353)
The focussed probe beam is directed to the NODE UNDER TEST and unblanked.

Step 5: (FIG. 9C, 354)
Beam unblanking is terminated when the induced current signal has declined to a value less than a predetermined value, i.e., $I_c < I_c$ LIMIT Step 6: (FIG. 9C, 355)
The focused probe beam is directed in turn to each of the nodes following the NODE UNDER TEST on the Augmented Shorts List and briefly unblanked on each. If the amplitude of the induced current signal of any node is below the predetermined value, $I_c$ LIMIT, the net or net fragment containing said node is shorted to the NODE UNDER TEST. An entry is made in the Final Shorts Report that NODE UNDER TEST is shorted to said node, and said node is deleted from the Augmented Shorts List (to avoid redundant testing).

Step 7: (FIG. 9C, 356)
Is the current NODE UNDER TEST the last node on the Augmented Shorts list?

If NO increment NODE UNDER TEST to the next node on the Augmented Shorts List (FIG. 9C, 357) and go to Step 4. (FIG. 9C, 353)

If YES, Shorts Delineation is complete and Final Shorts Report is complete. (FIG. 9C, 358)

Test Method 1 is now complete.

7.3 Capacitance Measurement Test Methods Using Induced Current Signal

The following test methods 2, 3 and 4 employ the same test system hardware as described for Test method 1. Test methods 2, 3, and 4 are however fundamentally different, because the system setup and and test sequence, in effect, measure net capacitance to perform the basic opens and shorts defect detection test. As mentioned previously, any open or short defect will change the capacitance of a least one node of a net by a factor of two or more, so only limited measurement accuracy is required for defect detection. For some applications, more accurate measurements of capacitance are however of inherent interest and Test Methods 3 and 4 address the need for measurement accuracy.

Capacitance based methods for basic opens and shorts defect detection have two very important advantages over charge storage methods as exemplified in Test Method 1.

First there is no longer any need for the test system to have full substrate deflection capability. The test of each node (i.e. the indirect measurement of its capacitance) is independent from the testing of all others. This is in contrast to the charge storage defect detection method where detection of a short is based on charge storage on a large number of previously tested nodes. With capacitance based defect detection the test system can have a relatively small deflection field and still achieve practical thruput since the tester measures the capacitance of each node within its deflection field, moves the substrate, again measures capacitances, etc. For basic defect detection there is never a need to revisit previously tested areas.

Elimination of the need for large deflection fields simplifies the test system optical and electronic design and construction thereby reducing its cost. Furthermore it permits smaller focussed probe sizes, thereby extending the applicability of the system to large substrates with very small features.

The second important advantage of capacitive defect detection relates to charge leakage effects. The net capacitance measurement is insensitive to charge leakage effects since testing of a net is typically completed in milliseconds, compared to seconds or minutes of charge storage required for a charge storage method such as that described for Test Method 1.

A complete substrate test includes in addition to the basic defect detection procedure, an optional shorts delineation test. Test methods 2, 3, and 4 share a common shorts delineation test which is an improvement over the basic shorts delineation method of Test method 1. The new method uses the measured capacitances from the basic defect detection test to increase the speed and efficiency of the basic shorts delineation test of Test Method 1. We refer to the improved test as Shorts Delineation with Capacitance Data. The description of Shorts Delineation with Capacitance Data is covered in section 7.3.5.

7.3.1. Capacitive Defect Detection

The capacitive defect detection process begins by establishing an initial potential on all nets using the global charging procedure. Next the bias potential of lower grid 48 is changed and individual nodes are addressed with the focussed probe beam. The induced current signal, $I_c(t)$, detected as the node is charged by the probe beam is filtered by signal processor 45, converted to digital form and transmitted to system controller 38. The filter bandwidth and digital sampling rate are chosen so that the digitized signal samples, $I_{c1}$, $I_{c2}$, $I_{c3}$ ... $I_{cn}$ faithfully represent the analog waveform, $I_c(t)$. We represent any of the digital samples, $I_{c1}$, $I_{c2}$, $I_{c3}$ ... etc. by the symbol $I_{ck}$. $I_{c1}$ is the first sample when the primary beam 138 is unblanked on a node. Ian is the last sample for any particular node test. The system controller 38 which may be a general purpose computer calculates a quantity $X_m$ from the samples, $I_{ck}$, which is directly related to node capacitance. The algorithm for calculating $X_m$ is specified for each test method. The value $X_m$ obtained under a specific set of operating conditions is compared to a standard value, $X_s$, for each net which is part of the substrate test data. Test methods 2, 3 and 4 differ in the test system setup, the processing algorithm applied to the samples $I_{ck}$, and the corresponding standard values, $X_s$.

Standard values for each test method are obtained by measurements in the electron-beam tester of a known good substrate or calibration standard, or by analysis of measurement data from a group of substrates. Alternatively capacitance data can be obtained by measurements using mechanical probers, or by calculations based on the geometry of substrate networks.

As mentioned above, one of the major advantages of the capacitive defect detection is that the test system is not required to have full substrate deflection capability. The generic test procedure is therefore described for the case where the substrate 36 is moved by table 32 to a number of different test positions so that all nodes to be tested can be addressed by the electron beam 138. The specific test positions are determined in advance so that complete test coverage is obtained. The test positions are arranged in a sequence to minimize table movement, e.g. a boustrophedontic sequence. Corresponding to each test position, there is a net list containing the substrate net and node information.

GENERIC CAPACITIVE OPENS AND SHORTS DEFECT DETECTION

Figure 10A:
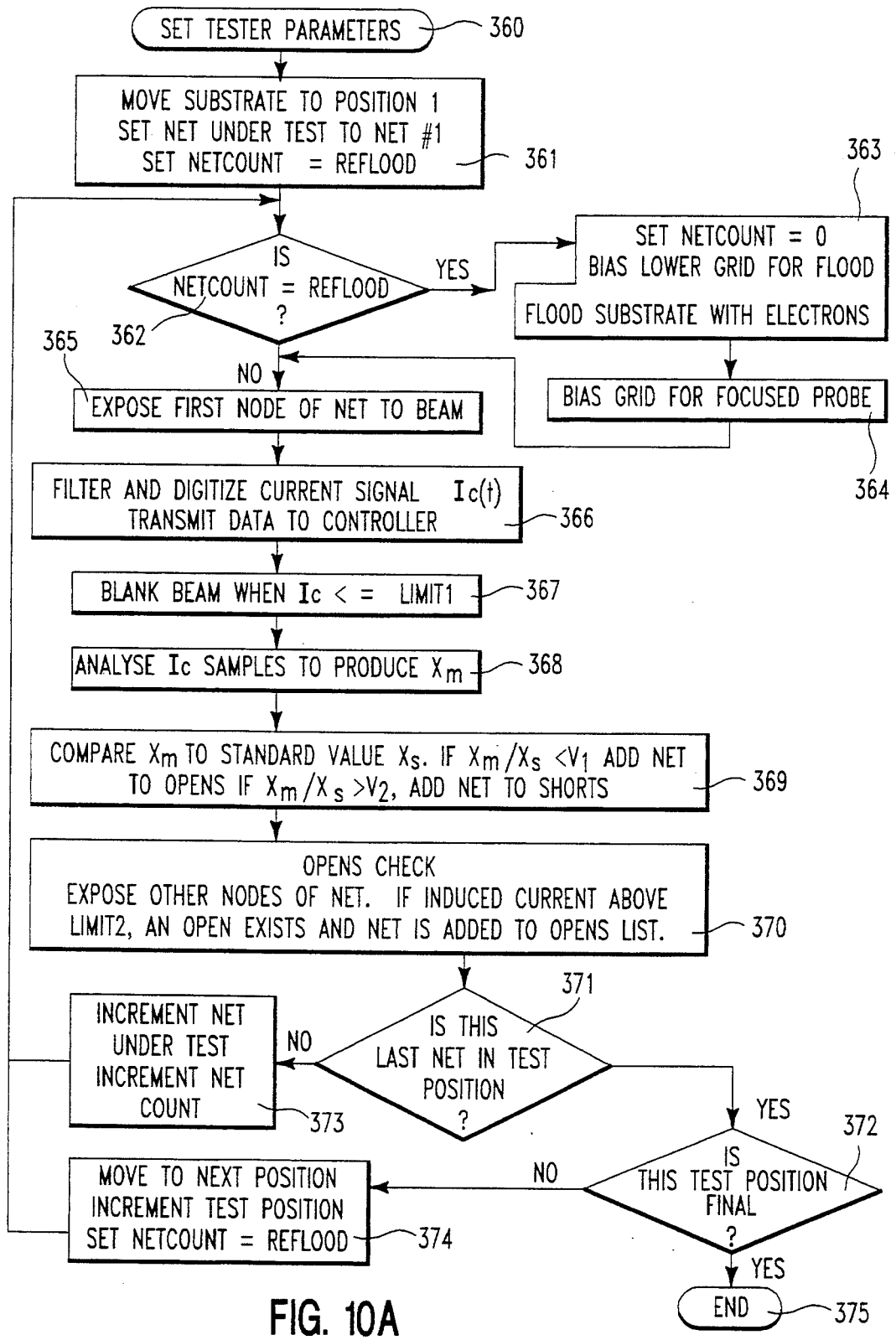
FIG. 10A is a flow chart of the generic capacitive opens and shorts detection procedure.

The detailed generic Capacitive Opens and Shorts detection procedure is illustrated in FIG. 10A, and described below. The procedure is controlled by the variables, TEST POSITION, NET UNDER TEST, and NET COUNT. The generic test procedure is particularized to Test Method 2, 3, or 4 by specification of the tester setup and analysis parameters in Step 1 (FIG. 10A, 360), and by the analysis method used in Step 9 (FIG. 10A, 368). These parameters are indicated by capitalized names.

Step 1: (FIG. 10A, 360)
Tester parameters are set.
Step 2: (FIG. 10A, 361)
The substrate is moved to test position 1 by the table 32. The variable TEST POSITION is set to #1. The variable NET UNDER TEST is set to net #1. The variable NET COUNT is set equal to REFLOOD.

Step 3: (FIG. 10A, 362)
   Is NETCOUNT=REFLOOD?
   If YES go to Step 4. (FIG. 10A, 363)
   If NO go to Step 6. (FIG. 10A, 365).
Step 4: (FIG. 10A, 363)
   Set NETCOUNT=0 Perform Global charging as follows: The lower grid 48 is biased to voltage, $V_{GRID\text{-}GLOBAL}$. The contacted conductive structure is biased to $V_{COND\text{-}GLOBAL}$. The substrate 36 is flood irradiated by electron guns 42 incorporated into the chamber, or raster scanned by the primary beam 138.
Step 5: (FIG. 10A, 364)
   The potential of lower grid 48 is changed to $V_{GRID\text{-}LOCAL}$. The potential of the contacted conductive structure 43 or 59 is changed to $V_{COND\text{-}LOCAL}$.
Step 6: (FIG. 10A, 365)
   The primary beam 138 is deflected to the first node of the NET UNDER TEST and turned on (unblanked).
Step 7: (FIG. 10A, 366)
   The induced current signal, $I_c(t)$ from the conductive structure 43, 59 is filtered and digitized by signal processor 46. The digitized data, $I_{c1}$, $I_{c2}$ etc is transmitted to controller 38 for analysis.
Step 8: Beam blanking. (FIG. 10A, 367)
   The beam is blanked by the system controller 38 acting by means of beam on-off control 18 when $I_c < LIMIT1$, a predetermined value. Transmission of the digitized data to controller 38 is stopped.
Step 9: Signal analysis (FIG. 10A, 368)
   The digital samples, $I_{ck}$, of the induced current signal in the conductive structure 43, 59 are analyzed to produced the measured value $X_m$.
Step 10: (FIG. 10A, 369)
   $X_m$ calculated in step 9 (FIG. 10A, 368) is compared to the standard value, $X_s$, contained in the substrate test data.
   If $X_m/X_s <= V1$, a predetermined value (nominally 0.5) the Net under Test is added to the Opens List.
   If $X_m/X_s \geq V2$, a predetermined value (nominally 2), the NET UNDER TEST is added to the Shorts List.
Step 11: Additional Nodes Open Check (FIG. 10A, 370)
   If there are other nodes of the NET UNDER TEST within the deflection field of the test system, i.e on the Netlist for the present TEST POSITION, they are checked for continuity to the first node of NET UNDER TEST.
   The beam is deflected to each of the remaining nodes in turn, and briefly unblanked. If the induced current signal $I_c > LIMIT2$, a predetermined value, an open exists. In that case, the NET UNDER TEST and the failing node are added to the Opens List.
Step 12: (FIG. 10A, 371)
   Is NET UNDER TEST the last net in TEST POSITION?
   If NO, increment NET UNDER TEST and increment NET COUNT and go to Step 3 (FIG. 10A, 362).
   If YES, Go to Step 13,
Step 13: (FIG. 10A, 372)
   Is TEST POSITION the final Test Position? (FIG. 10A, 372).
   If NO, move the substrate 36 to the next test position using table 32, and increment TEST POSITION (FIG. 10A, 374) and go to Step 3 (FIG. 10A, 362).
   If YES, Opens and Shorts Defect Detection is complete (FIG. 10A, 375).

The tester setup and analysis parameters required to complete the description of the capacitive defect detection are as follows:

REFLOOD is a constant which controls how often global charging is repeated during the test. Appropriate values for REFLOOD depend on the particular substrate, the number and density of the wiring networks and the degree of capacitive coupling between nets versus the coupling to the contacted conductive structure. Measurement repeatability and accuracy are improved if REFLOOD is a small number. A large value for REFLOOD shortens test time.

$V_{GRID\text{-}GLOBAL}$ specifies the bias potential applied to lower grid 48 during global charging, Step 4.

$V_{GRID\text{-}LOCAL}$ specifies the bias potential applied to lower grid 48 during individual node exposure, Steps 6, 7, 11.

$V_{COND\text{-}GLOBAL}$ specifies the potential applied to the contacted conductive structure during global charging, Step 4.

$V_{COND\text{-}LOCAL}$ specifies the potential applied to the contacted conductive structure during individual node exposure, Steps 6, 7, 11.

LIMIT1 specifies an induced current signal level which controls when node exposure to the primary beam is terminated in Step 8.

V1 specifies a criterion for capacitive open defect detection in Step 10. The nominal value of V1 is 0.5.

V2 specifies a criterion for shorts detection in Step 10. The nominal value for V2 is 2.

LIMIT2 specifies an induced current signal level which is used to detect an open defect in Step 11.

7.3.2 Test Method 2

Equilibrating Charge Measurement

The generic capacitive defect detection procedure described above is made specific by a) the choice of test system parameters (FIG. 10A, 360) and b) the specific algorithms used in the signal analysis step, step 9 (FIG. 10A, 368). For Test Method 2 these choices are made so that the measured quantity, $X_m$, is the total charge transferred by the induced current signal when nodes are individually addressed and driven to their equilibrium potentials. The total charge so transferred is proportional to the node capacitance.

Because Test method 2 is based on charge measurement through integration of the induced current signal, it has the advantage that measurement accuracy is unaffected by long term variations in primary beam current. If the current is reduced, the time required for a net to equilibrate will correspondingly increase with the result that the total charge transferred is unaffected.

TEST SYSTEM SETUP

Another advantage of Test Method 2 is that the system setup parameters are not critical. A wide range of choices for the parameters will produce acceptable results. One requirement is that $V_{GRID\text{-}GLOBAL}$, $V_{COND\text{-}GLOBAL}$, are sufficiently different from $V_{GRID\text{-}LOCAL}$, $V_{COND\text{-}LOCAL}$, that a detectable induced current signal is produced during Steps 6 and 7 (FIG. 10A, 365, 366) of the generic test sequence. A second requirement is that $V_{GRID\text{-}LOCAL}$ is not so large as to cause deleterious primary beam deflection or spot size degradation. It is desirable also to choose $V_{GRID\text{-}GLOBAL}$ approximately 2 V negative relative to $V_{COND\text{-}GLOBAL}$ to improve the uniformity of the global charging. Experimental results relating to Test Method 2 have been obtained with a prototype test system with the test system parameters as follows:

| REFLOOD | 1 |
|---|---|
| $V_{GRID\text{-}GLOBAL}$ | −2.0 V |
| $V_{COND\text{-}GLOBAL}$ | 0.0 V |
| $V_{GRID\text{-}LOCAL}$ | +20.0 V |
| $V_{COND\text{-}LOCAL}$ | 0.0 V |
| LIMIT1 | $I_{c1}/100.0$ |
| LIMIT2 | $I_{c1}/3.0$ |
| $V_1$ | 0.5 |
| $V_2$ | 2.0 |

Capacitive Opens and Shorts Defect Detection-Test Method 2

Having described the test system setup parameters for Test Method 2 we now describe the capacitive opens and shorts defect detection procedure. The description is in terms of the steps defined for the generic capacitive open and short defect detection procedure defined in section 7.3.1, and illustrated in FIG. 10A. Steps 1 thru 8 inclusive (FIG. 10A, 360–367) are identical to the generic procedure of section 7.3.1.

For the experimental prototype system, the global charging procedure of Step 4 used a raster scan of the primary beam over an area of 4 mm×4 mm.

Figure 10B:
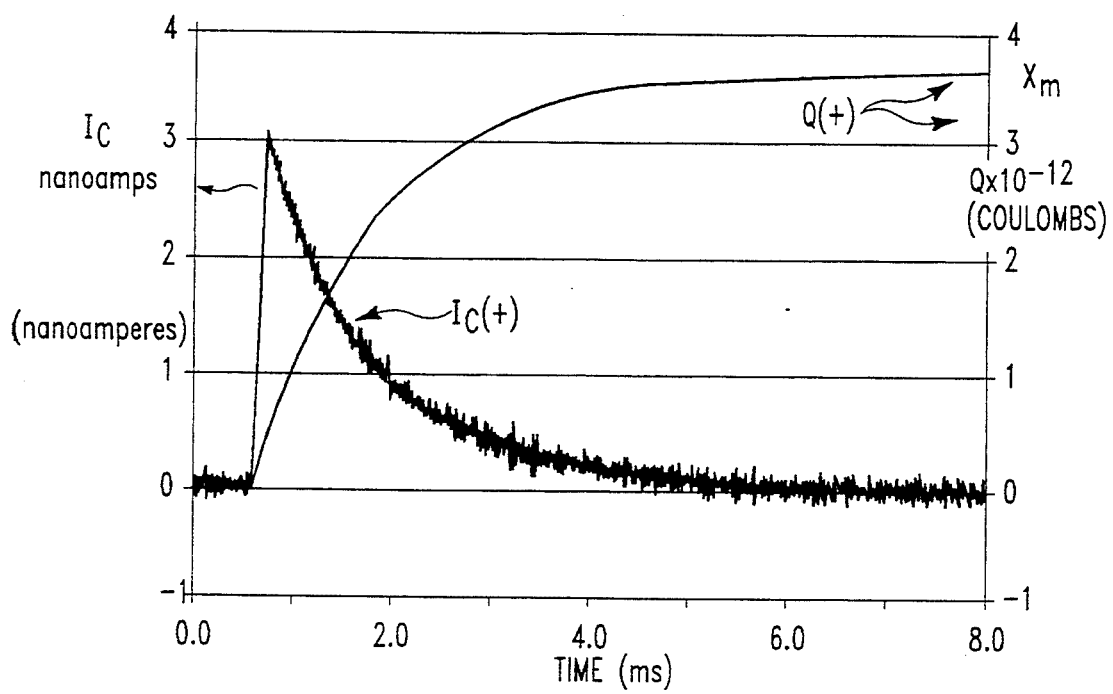
FIG. 10B illustrates the induced current signal detected in an experimental system and the measurement of the equilibrating charge according to Test Method 2 of the invention.

A typical induced current signal recorded from a substrate node during Step 6 and 7 (FIG. 10A, 365–366) of the test is illustrated in FIG. 10B. These data are from a prototype test system setup as described above.

The parameter LIMIT1 used in Step 8 (FIG. 10A, 367) is set to a small value so that nodes are driven to their equilibrium potential. Appropriate values for LIMIT1 are in the range of $I_{c1}/100$. The primary beam 138 is blanked when any sample $I_{ck} < = \text{LIMIT1}$. As before the first signal sample we represent by $I_{c1}$; the last signal sample we represent by $I_{cn}$.

The signal analysis of step 9 (FIG. 10A, 368) is now described for Test Method 2. The digital samples, $I_{ck}$, of the induced current signal in the contacted conductive structure 43, 59 are integrated to measure the charge Q transferred by the induced current. The integral is calculated by any of the standard formulae of numerical integration, e.g., $$X_m = Q = \delta t * (1/2 \, (I_{c1} + I_{cn}) + \Sigma \, I_{ck})$$

$$k = 2 \text{ to } n - 1$$

$\delta t$ = time interval between digital samples
$I_{c1}$ = first digital sample
$I_{cn}$ = last digital sample In FIG. 10B the measurement of the equilibrating charge, by the method described above is illustrated by the curve labeled Q(t). The vertical scale for the Q(t) curve is at the right of the graph. The final value of Q(t) which is $X_m$, the measured equilibrating charge, is also indicated in FIG. 10B.

Figure 10C:
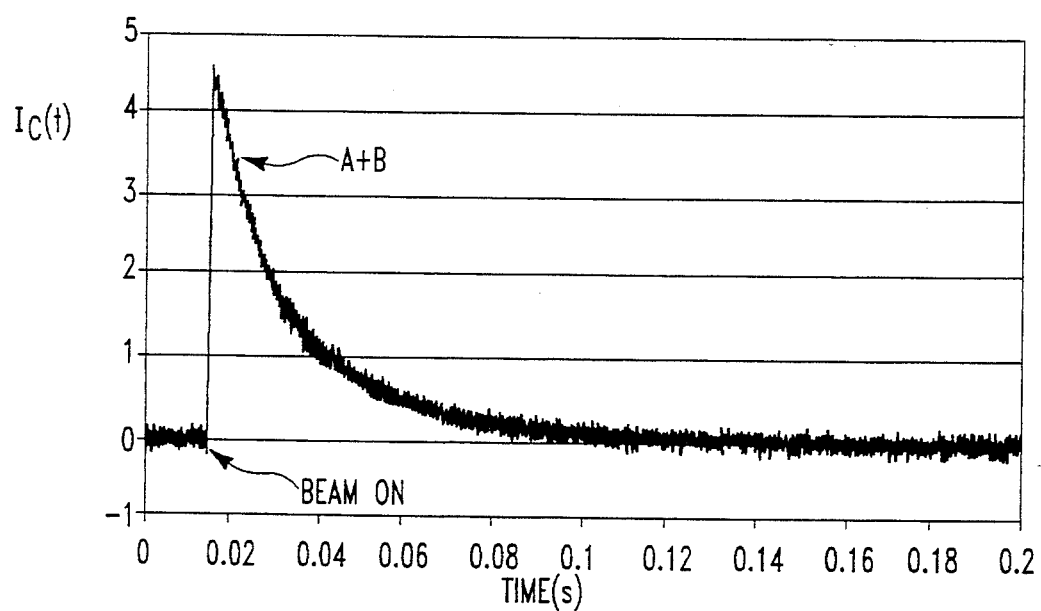
FIG. 10C illustrates the repeatability of the measurement of $I_c(t)$. The data are from the same node on two substrates of the same type.

FIG. 10C illustrates the repeatability of the induced current signal during Steps 6, 7 (FIG. 10A 365, 366) of Test Method 2 by showing the induced current signal obtained on the corresponding node for two different substrates.

7.3.3 Test Method 3

Non-Equilibrating Charge Measurement

Test Method 3, like Test Method 2, is based on the generic capacitive open and short defect detection procedure illustrated in FIG. 10A and described in section 7.3.1. Moreover, the analysis method of Step 9 (FIG. 10A 368) involves signal integration as with Test Method 2. The basic idea of Test Method 3 is to provide improved capacitance measurement accuracy and repeatability by more careful selection of test system parameters, and improved signal analysis, while reducing test time. Testing repeatability is improved because the potential of each node at the start of the integration period is better standardized. The test is faster than Test method 2 because nodes are driven only part-way toward their equilibrium potentials. Faster testing also helps to improve repeatability by reducing or eliminated beam-induced build up of carbonaceous material on the test nodes. The improved repeatability makes the test method suitable for absolute capacitance measurement with appropriate calibration procedures, such as measurements on nodes of known capacitance.

Test method 3 begins with an initial setup procedure, described below, to determine appropriate values for the test parameters, $V_{GRID\text{-}GLOBAL}$, $V_{GRID\text{-}LOCAL}$, $V_{COND\text{-}GLOBAL}$, and $V_{COND\text{-}LOCAL}$.

Figure 10D:
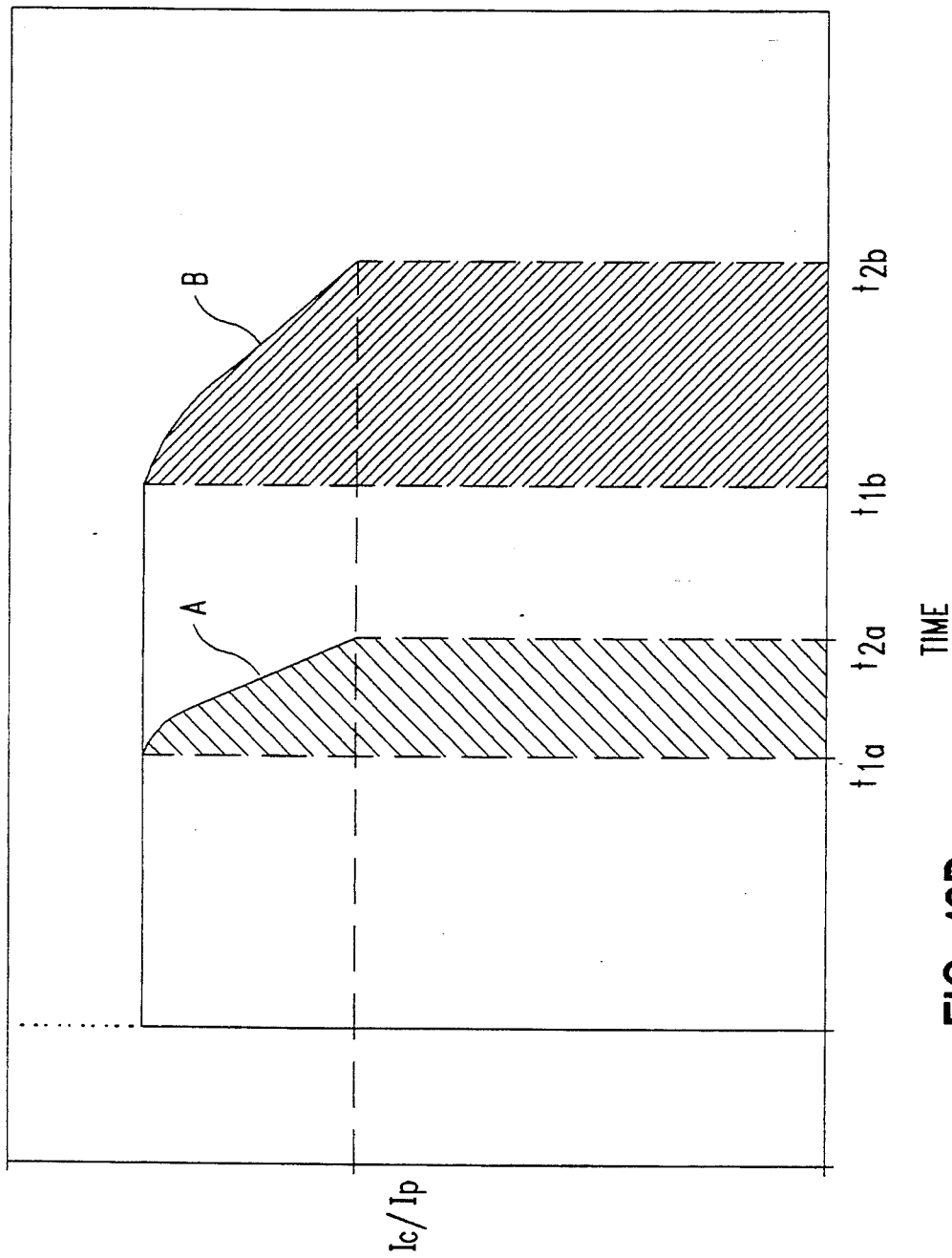
FIG. 10D illustrates the signal analysis technique of Test Method 3 wherein measurements are made of the charge transferred in a particular time interval.

Assuming the tester has been properly set up, FIG. 10D illustrates the signal analysis method for two nodes with different capacitance. Charge transfer measurement for node A begins at time $t_{1a}$ when the induced current signal starts to decline from its saturated value. Charge transfer measurement ends at time $t_{2a}$ when the signal has declined to some fraction of its initial amplitude, e.g. 70%. The charge transferred during the time interval $t_{2a}-t_{1a}$ is represented by the shaded area under curve A of FIG. 10D and is proportional to the net capacitance. The corresponding measurement on a second node of different capacitance is also illustrated by FIG. 10D (Curve B.)

TEST SYSTEM SETUP

The lower grid and conducting structure potentials must be chosen so that the induced current signal is initially saturated in Step 6 of the generic defect detection test procedure of section 7.3.1 and FIG. 10A, 365. To achieve this the local field at all nodes must assist SE emission. This is accomplished by choosing $V_{GRID\text{-}GLOBAL}$ and $V_{COND\text{-}GLOBAL}$ sufficiently negative relative to $V_{GRID\text{-}LOCAL}$. Appropriate values are determined by a setup procedure which observes the induced current signals from a "known good" substrate, or calibration standard, and adjusting the voltage parameters appropriately.

Figure 10E:
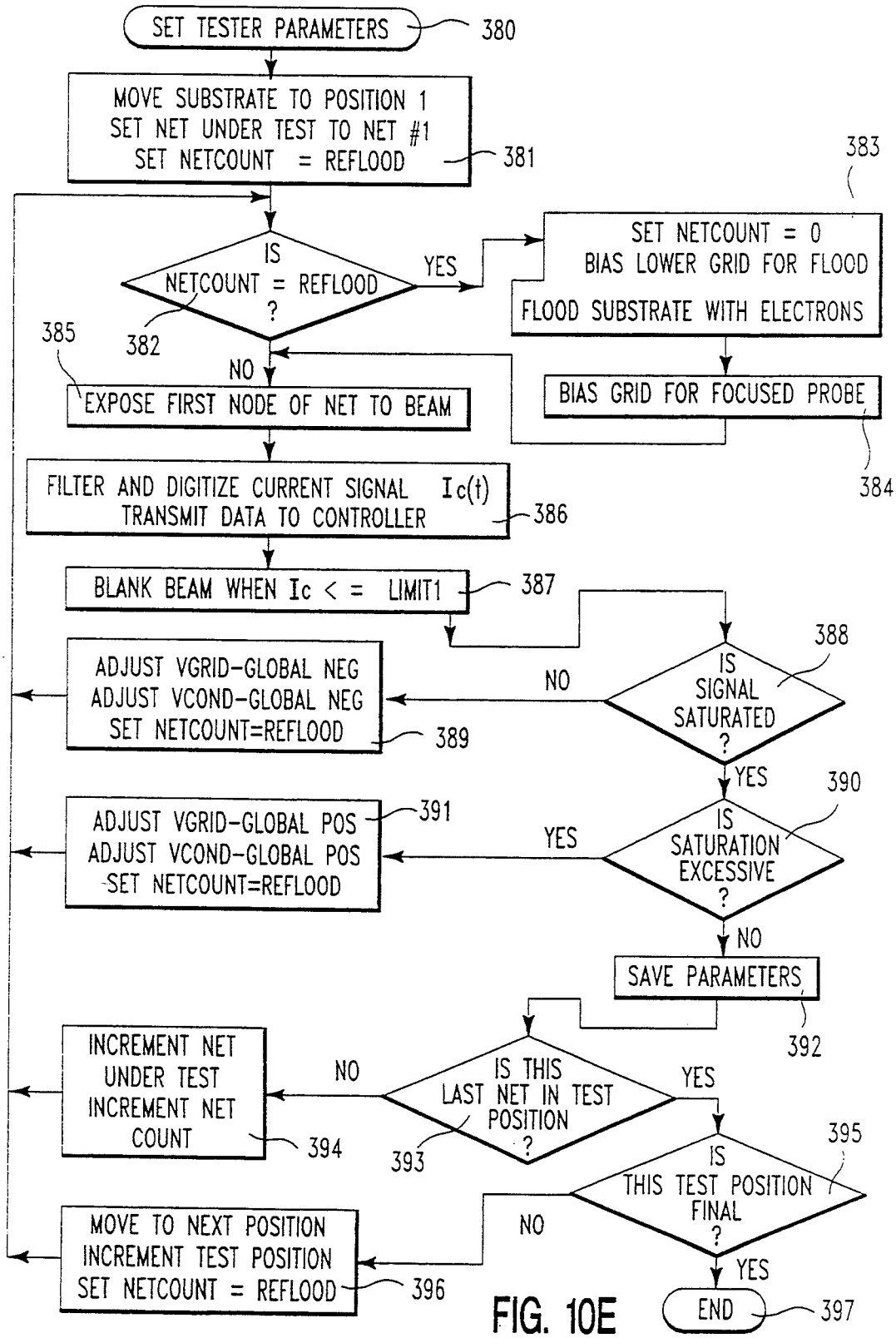
FIG. 10E is a flow chart of the tester set-up procedure for Test Method 3.

This setup procedure is illustrated in FIG. 10E. The setup procedure is identical to the generic capacitive defect detection procedure of section 7.3.1 for steps 380 to 387 inclusive in FIG. 10E. In the next step (FIG. 10A, 388) the signals, $I_{ck}$, are analyzed for initial saturation. By "saturation" we mean that there exists a sequence of successive signal samples starting from $I_{c1}$, up to some sample, $I_{ck}$, $k \geq 2$, such that all samples in the sequence are identical apart from slight variations due to noise. Appropriate criteria for the expected signal variation due to noise will vary depending on the primary beam current, the current amplifiers and other factors. If, for any node the induced current signal is not initially saturated, the system goes to step 389 where $V_{GRID-GLOBAL}$ and $V_{COND-GLOBAL}$ are decreased, i.e. made more negative relative to $V_{GRID-LOCAL}$ and $V_{COND-LOCAL}$, and NETCOUNT is set to REFLOOD and we go to step 382 to continue. The process repeats as shown in FIG. 10E until the node displays a saturated signal.

To maximize tester thruput, it is desirable to insure that the signal saturation does not continue for too long a time. Step 390 tests whether the number of saturated samples is greater than some predetermined value, LIMIT2. If YES the system goes to Step 391 where the values $V_{GRID-GLOBAL}$, $V_{COND-GLOBAL}$ are made less negative relative to $V_{GRID\ LOCAL}$, $V_{COND-LOCAL}$, and NETCOUNT is set to REFLOOD. The process continues to step 382. The procedure continues from step 382 to step 390 etc. until the parameters are correctly adjusted for all nodes at all table positions.

The parameter adjustment process of FIG. 10E continues until those grid bias values which are just sufficient to saturate a node are determined for all nodes. This information is recorded for all nodes in step 392, during the setup procedure.

Before the defect detection test begins, the net list is resorted so that nets are grouped according to the parameter values required. Each group of nodes is then tested with parameter values appropriate for that group. This approach will improve tester thruput by minimizing the beam on time required before the measurement period begins at time $t_{1a}$ or $t_{1b}$ of FIG. 10D.

CAPACITIVE OPENS AND SHORTS DEFECT DETECTION-TEST METHOD 3

Having described the setup procedure for Test Method 3 we now describe the capacitive opens and shorts defect detection procedure. The description is in terms of the steps defined for the generic capacitive open and short defect detection procedure defined in section 7.3.1, and illustrated in FIG. 10A. With the exception of Steps 9 (FIG. 10A, 368), and 11 (FIG. 10A, 370), the steps of Test Method 3 are identical to the generic procedure of section 7.3.1.

The parameter LIMIT1 used in Step 8 (FIG. 10A, 367) is set to a larger value than for Test Method 2 so that node exposure time is reduced. Appropriate values for LIMIT1 are in the range of $I_{c1}/2$. The primary beam 138 is blanked when any sample $I_{ck} <=$ LIMIT1. As before the first signal sample we represent by $I_{ck}$; the last signal sample we represent by $I_{cn}$.

The signal analysis of step 9 (FIG. 10A, 368) is now described for Test Method 3. Certain of the digital samples, $I_{ck}$, of the induced current signal in the contacted conductive structure 43, 59 are integrated to measure the charge Q transferred by the induced current during a particular time interval. The first sample used in the measurement is the first sample to satisfy the relation as follows:

$$I_{ck} <= I_{c1} - \delta I,$$

where $\delta I$ is a predetermined constant.

We represent this sample by the symbol $I_{cj}$. The integral is calculated by any of the standard formulae of numerical integration, e.g., $$X_m = Q = \delta t * (1/2\ (I_{cj} + I_{cn}) + \Sigma\ I_{ck})$$

-continued
$$k = j + 1\ to\ n - 1$$

where $\delta t$ = the time interval between digital samples of the induced current signal.

For Step 11 (FIG. 10A, 370) which checks other nodes of the NET UNDER TEST for opens (if there are any within the current TEST POSITION), it is desirable to insert an additional exposure of the first node of NET UNDER TEST. Recall that the variable LIMIT1 terminated exposure of node 1 after only a modest reduction in the induced current signal. If there are additional nodes of NET UNDER TEST to be checked for opens it is desirable to expose the first node for an additional period of time. The additional exposure is terminated when the induced current signal is less than LIMIT2, a predetermined value. Step 11 then continues as described in section 7.3.1 (FIG. 10A, 370) to check other net nodes for opens.

7.3.4 Test Method 4

Exponential Curve Fitting

Test Method 4, like Test Method 3, is based on the generic capacitive open and short defect detection procedure illustrated in FIG. 10A and described in section 7.3.1.

However, for Test method 4, the analysis method of Step 9 of the generic defect detection procedure involves curve fitting rather than signal integration. The curve fitting technique of Test Method 4 is based on the observation that the induced current signal takes on a purely exponential character as the equilibrium potential is approached, i.e, for $I_c/I_{SAT}$ approximately 0.3 or less, and that the time constant of the exponential decay is proportional to the node capacitance. This behavior is predicted by the model of Appendix A, illustrated in FIG. 4E, and also observed experimentally.

Test method 4 begins with an initial setup procedure to determine appropriate values for the test parameters, $V_{GRID-GLOBAL}$, $V_{GRID-LOCAL}$, $V_{COND-GLOBAL}$, and $V_{COND-LOCAL}$. The setup adjusts these parameters so that the induced current signal obtained in Step 6 (FIG. 10A, 364) of the defect detection test is small compared to the saturated signal levels of Test Method 3.

Figure 10F:
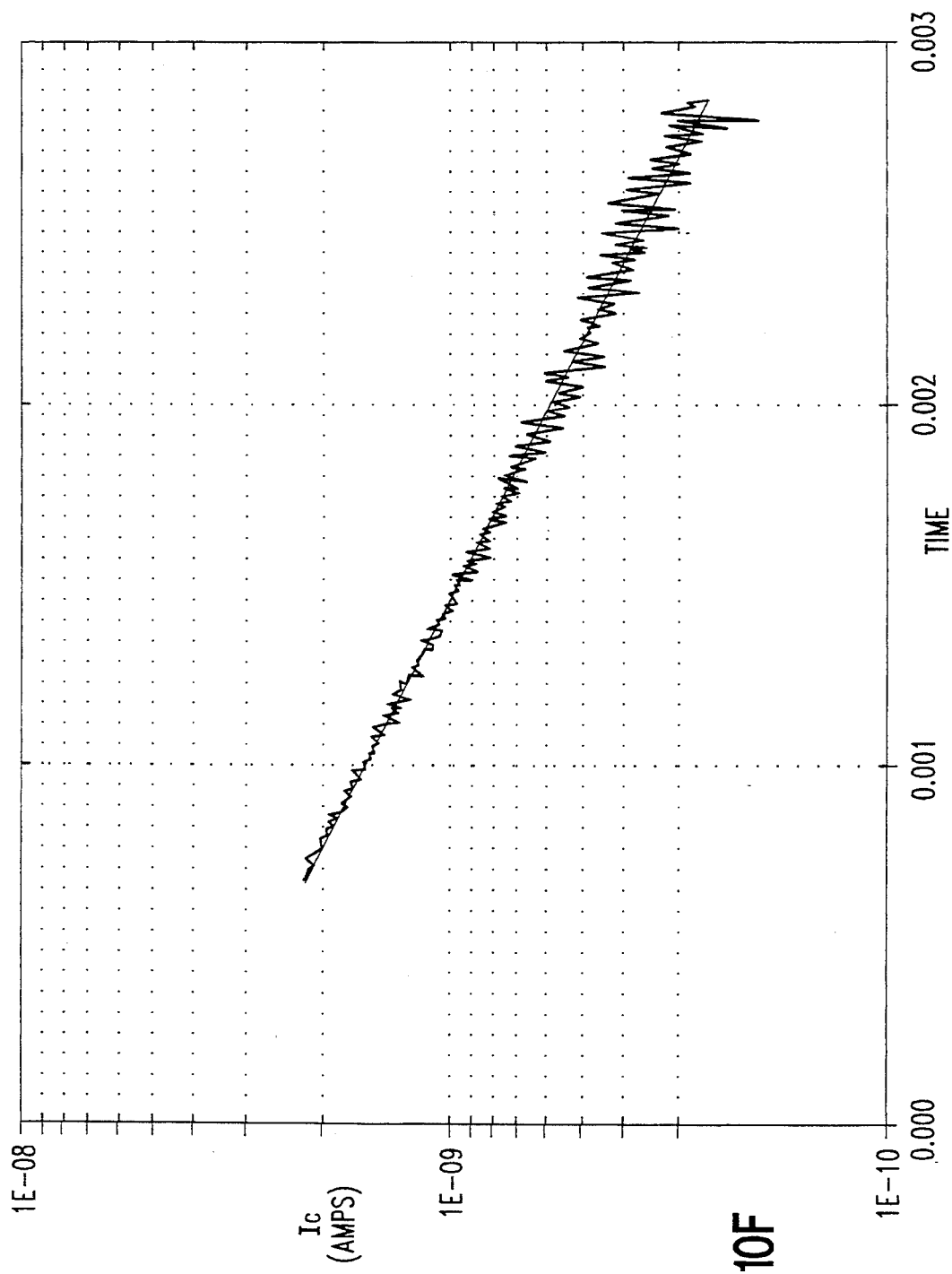
FIG. 10F illustrates the signal analysis technique of Test Method 4 wherein measurements are made of the decay rate of the induced current signal.

Assuming the tester has been properly set up, as described below, FIG. 10F illustrates the signal analysis method applied to actual data obtained with a prototype test system. As is well known, a signal with an exponential decay plotted on a semi-log scale will show a straight line slope. FIG. 10F shows a semi-log plot of a measured induced current signal from a prototype system. Also shown is a calculated fit to the experimental data. In this case the calculated fit was done by a commercially available "spread sheet" program.

The time constant, $\tau$, of the exponential function is related to the node capacitance, C, and the primary beam current, $I_p$, by the equation as follows:

$$\tau = R * C / I_p$$

where R is a constant characteristic of a node. The quantity $X_m = \tau * I_p$ is a suitable measured value which is compared to standard values to detect defects.

$I_p$, the primary beam current, is measured before the test begins and held constant by well known methods from the fields of electron microscopy and electron beam lithography.

Test Method 4 has the advantage that the time constant measurement is insensitive to the exact initial potential of a node so measurement repeatability is good. Furthermore the method involves the imposition of small potential differences between networks (approximately 1 Volt or less) which reduces or eliminates the possibility of electrical damage to the substrate caused by testing.

A disadvantage of Test Method 4 is that capacitance measurement accuracy, and repeatability is adversely affected if the actual beam current impinging on a node varies from the nominal value, $I_p$ because of beam spillover or inaccurate addressing. This problem is avoided by the charge transfer measurement approaches of Test Methods 2 and 3, which are therefore more appropriate when the size of the features to be tested is smaller than or comparable to the electron probe size.

TEST SYSTEM SETUP

The lower grid and conducting structure potentials must be chosen so that the induced current signal is small compared to the saturated values described above for Test Method 3. Appropriate values are determined by observing the induced current signals from a "known good" substrate, or calibration standard, and adjusting the parameters according to the procedure now described.

The setup procedure of Test Method 4 consists of two parts. The first part determines the saturated signal values for a representative substrate. This is done by the setup procedure described above for Test Method 3, and illustrated in FIG. 10E. In Step 392 of FIG. 10E which saves parameters, the value of the saturated signal level, $I_{SAT}$, is also saved for each node.

Figure 10G:
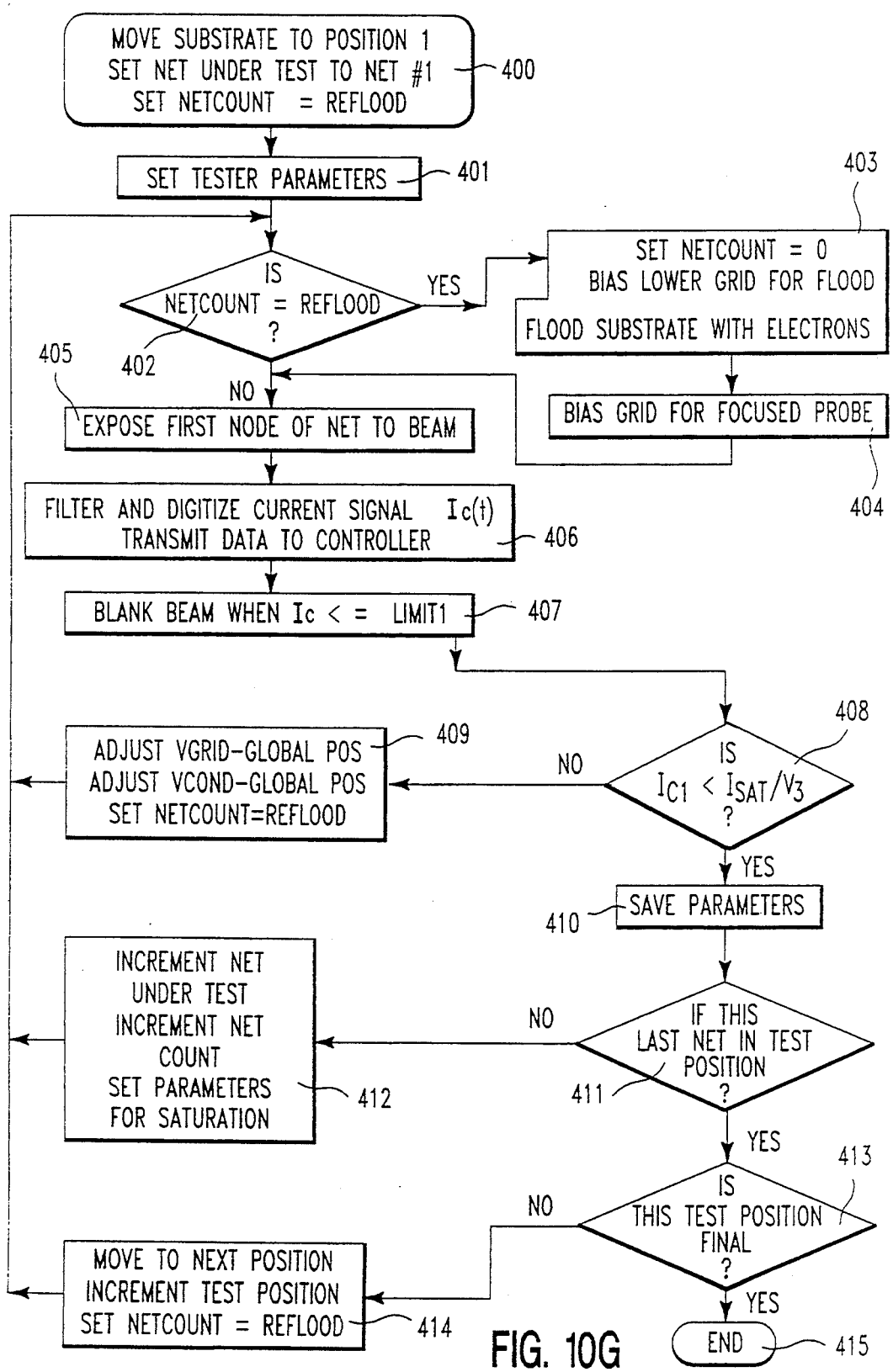
FIG. 10G is a flow chart for a portion of the tester set-up procedure for Test Method 4.

The values, $I_{SAT}$, are used in the second part of the setup procedure of Test Method 4, as illustrated in FIG. 10G starting with step 400 which involves moving the substrate to position 1 and setting the net under test to net #1, plus setting the NETCOUNT=REFLOOD. In Step 401 of FIG. 10G, the tester parameters are set to those values determined previously to produce a saturated induced current signal. In Step 408, the induced current value actually read is compared to $I_{SAT}/V_3$, $V_3$ being a predetermined parameter which is nominally equal to 3.3. This nominal value of $V_3$ is based on the model of the charging process described in Appendix A. $V_3$ should be adjusted depending on the capacitance measurement accuracy required of the tester. If $I_c$ is too large, Step 409 adjusts $V_{GRID-GLOBAL}$, and $V_{COND-GLOBAL}$ to be less negative compared to $V_{GRID-LOCAL}$, and $V_{COND-LOCAL}$, and sets NETCOUNT so that global charging occurs and goes back up to Step 402. When $I_c < I_{SAT}/V_3$, the parameters are saved in step 410. The process is repeated for all nodes and all table positions.

CAPACITIVE OPENS AND SHORTS DEFECT DETECTION-TEST METHOD 4

Having described the setup procedure for Test Method 4 we now describe the capacitive opens and shorts defect detection procedure. The description is in terms of the steps defined for the generic capacitive open and short defect detection procedure defined in section 7.3.1 and illustrated in FIG. 10A. With the exception of Step 9 (FIG. 10A, 368), the steps of Test Method 3 are identical to the generic procedure of section 7.3.1.

The value of the parameter, LIMIT1, used in Step 8 (FIG. 10A, 367) is not critical. A value of approximately $I_{SAT}/10$ would be appropriate. The primary beam 138 is blanked when any sample $I_{ck} < =$ LIMIT1 in step 367, FIG. 10A. As before we represent the last signal sample by $I_{cn}$.

The signal analysis of step 9 (FIG. 10A, 368) of the capacitive defect detection procedure is now described for Test Method 4. The digital samples, $I_{ck}$, of the induced current signal in the contacted conductive structure 43, 59 are fitted by an equation of the form as follows:

$$I_{ck} = I_{c1} e^{-(k*\delta t)/\tau}$$

where $\delta t$ is the time interval between samples, and k is an index running from 1 to n, which labels the samples.

The fitting parameter $\tau$ is determined by standard "least squares" methods of numerical analysis as described in "Data Reduction and Error Analysis for the Physical Sciences", McGraw-Hill Book Company, New York, (1969)

The quantity, $X_m = \tau * I_p$, is compared against standard values in Step 10 (FIG. 10A, 369) of the defect detection procedure. For Step 11 (FIG. 10A, 370), which checks other nodes of the NET UNDER TEST for opens, the parameter LIMIT2 is chosen so that $$I_{SAT}/V_3 > \text{LIMIT2} > \text{LIMIT1}.$$

Step 371 checks whether all nets have been tested in the current table position. If not step 373 increments the net under test and increments the net count and goes back up to step 362. When all nets have been tested in a given test position, step 372 checks whether the current test position is the final test position. If not, step 374 moves the table to the next test position and sets NETCOUNT=REFLOOD and goes to step 362. When the procedure finishes the last net in the last test position, it is finished (step 375.)

This concludes the description of capacitive open and shorts defect detection methods.

7.3.5 Shorts Delineation Test with Capacitance Data

Three capacitive open and short defect detection procedures have been described. As discussed in section 7.2, the Shorts List resulting from the defect detection 7.3.1 may not identify all nets involved in shorts. If complete information about shorts is desired additional testing is required. This testing we have called shorts delineation. The Shorts Delineation Test described in Section 7.2 can be improved by making use of the net capacitance data generated by Test Methods 2, 3, or 4. We now describe the improved Shorts Delineation Test with Capacitance data.

For the descriptions which follow it is assumed that the test system does not have full substrate deflection capability. The basic idea of the improved method is to use the capacitance data to reduce the number of nets which have to be checked for each short and to reduce the amount of table movement required to pair shorts. Of course all nets involved in a particular short will have the same value of $X_m$, apart from measurement errors. Call this value $X_p$. When looking for other nets involved in a short, the system therefore only checks nets which could possibly be involved, i.e. those with values $X_m$ "sufficiently similar" to $X_p$.

Data from a particular test system and test method must be collected and analyzed to define criteria for "sufficiently similar". Repeated measurements on a calibration standard are analyzed to characterize tester repeatability quantitatively. The performance of a tester can then be summarized by an equation as follows:

$$X_{actual} = X_m \pm a^* X_m \pm b$$

where $X_{actual}$ is an accurate measurement determined by mechanical probing or other means, $X_m$ are measured values with the particular E-beam test system and test method, and a and b are parameters characterizing the tester accuracy. The quantities a and b are chosen so that all nets possibly shorted to a particular net, with measured value $X_{mp}$, satisfy the relation $$Abs\ (X_{mk} - X_{mp}) < a^*(X_{mk} + X_{mp}) + 2b.$$

For a particular net, (# p in the example above), any other net having an $X_{mk}$ value such that the relation above is satisfied, we call "a possible short" for net p.

Inputs to the Shorts Delineation Test are the Opens List and Shorts List from the Opens and Shorts Defect Detection Test described above, and the measured quantities $X_m$ for each net. The output of the Shorts Delineation Test is a Final Shorts Report.

Figure 10H:
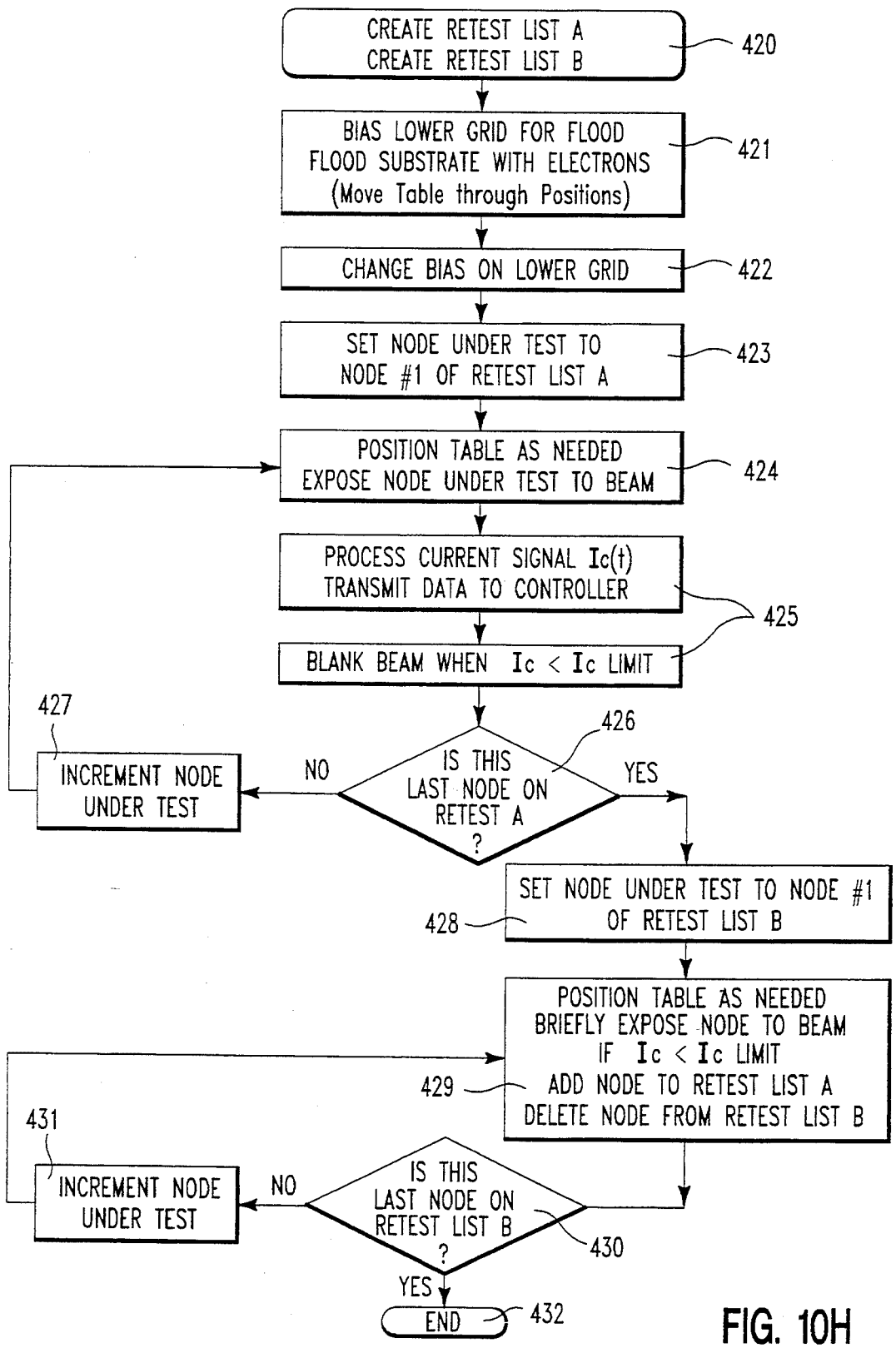
FIG. 10H is a flow chart of the procedure for discovering additional shorted nodes using capacitance data.
Figure 10I:
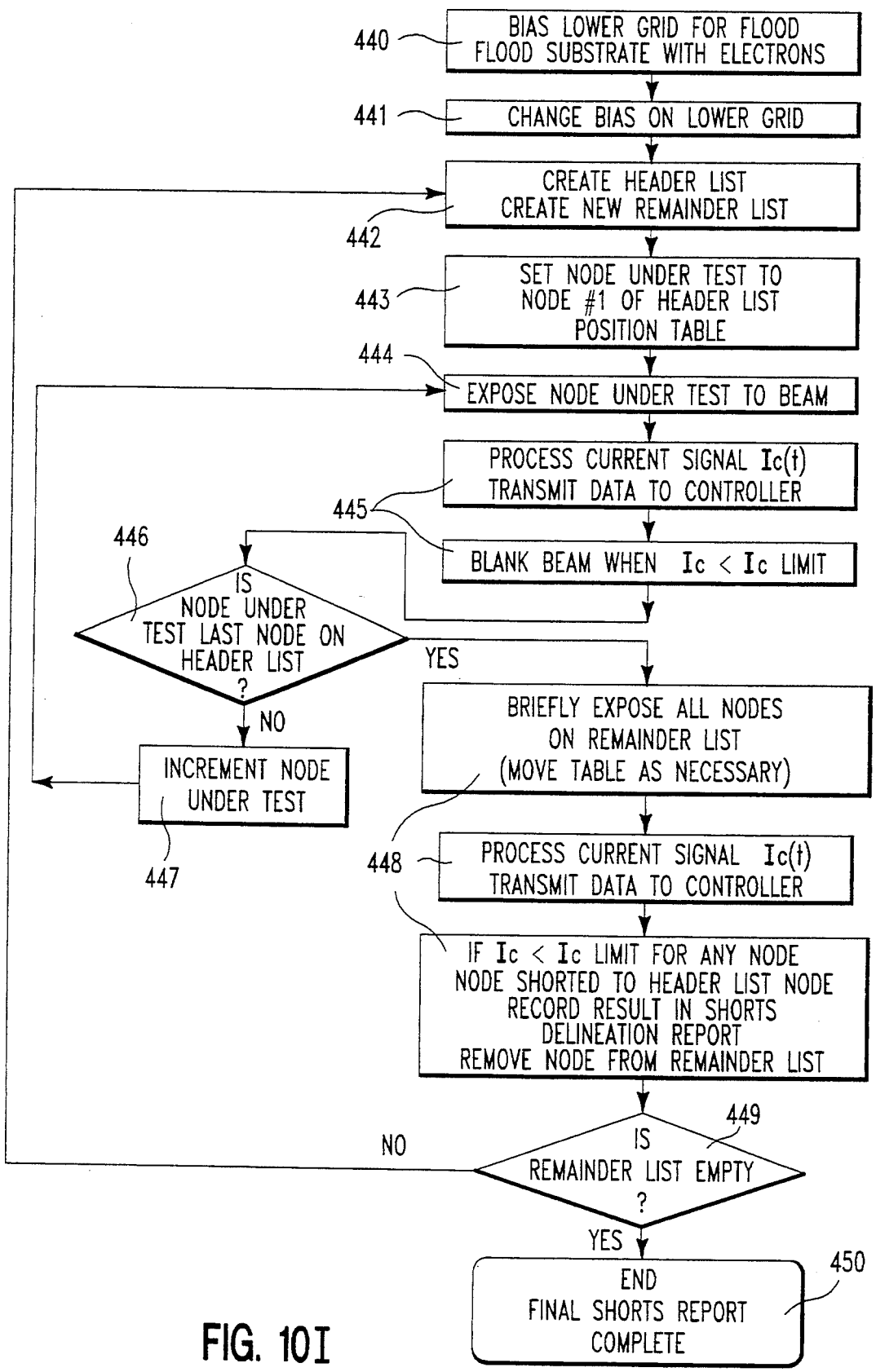
FIG. 10I is a flow chart of the procedure for pairing shorted nodes using capacitance data.

The Shorts Delineation Test consists of two parts which are shown in FIG. 10H and FIG. 10I and described below. The first part of the Shorts Delineation Test discovers additional shorted nodes and nets and produces the Augmented Shorts List; the second part of the Shorts Delineation Test uses the Augmented Shorts List to delineate all nets or nodes involved in each short and produces the Final Shorts Report.

ADDITIONAL SHORTED NODE DISCOVERY WITH CAPACITANCE DATA

This procedure is illustrated in FIG. 10H and is described in detail as follows:

Step 1: (FIG. 10H, 420)

A list called the Retest List A is compiled from the Shorts List and Opens List. The Retest List A contains one node from each net on the Shorts list, and all nodes from all nets on the Opens List. A second list called Retest List B is also compiled. Retest List B contains one node from every net which meets two conditions; first that the net has no nodes on Retest List A and second that the net is a "possible short" as defined above, for at least one node on Retest List A. Retest List A and Retest List B are sorted so that test data is divided into sections, one section for each table position. Further the table positions are ordered to minimize table movement.

Step 2: (FIG. 10H, 421)

Global Charging; The grid 48 is biased to voltage $V_{GRID-GLOBAL}$. The contacted conductive structure is biased to $V_{COND-GLOBAL}$. At each table position the substrate is flood irradiated by the flood guns 42, or by raster scanning primary beam 138.

Step 3: (FIG. 10H, 422)

The potential on the lower grid 48 is biased to $V_{GRID-LOCAL}$. The potential of the contacted conductive structure 43 or 59 is changed to $V_{COND-LOCAL}$.

Step 4: (FIG. 10H, 423)

The variable NODE UNDER TEST is set to node #1 on Retest List A.

Step 5: (FIG. 10H, 424)

The table is positioned as required to expose NODE UNDER TEST to the focused probe beam. The focussed probe beam is directed to NODE UNDER TEST and unblanked.

Step 6: (FIG. 10H, 425)

Beam unblanking is terminated when the induced current signal has declined to a value less than a predetermined value, i.e. $I_c < I_c$ LIMIT.

Step 7: (FIG. 10H, 426)

Is NODE UNDER TEST=last node on Retest List A?

If NO set NODE UNDER TEST=next node on Retest List A (FIG. 10H, 427) and go to Step 5.

If YES go to Step 8. (FIG. 10H, 428)

Step 8: (FIG. 10H, 428)

Set NODE UNDER TEST to Node #1 on RETEST LIST B.

Step 9: (FIG. 10H, 429)

The table is positioned as required to expose NODE UNDER TEST to the focused probe beam. The focused probe beam is directed to NODE UNDER TEST and briefly unblanked. If the amplitude of the induced current signal is less than a predetermined value, $I_c$LIMIT, then NODE UNDER TEST is added to the Retest List A and deleted from Retest List B.

Step 10: (FIG. 10H, 430)

Is NODE UNDER TEST=last node on Retest List B?

If NO set NODE UNDER TEST=next node on Retest List B (FIG. 10H, 431) and go to Step 9 (FIG. 10H, 429).

If YES Additional Shorted Node Discovery is complete. (FIG. 10H, 432)

Retest List A, as modified by the above procedure is the desired test output, the Augmented Shorts List. The Augmented Shorts List contains all nets and nodes involved in shorts. Identifying all nets and nodes involved in each short is done by the shorts pairing procedure described next.

SHORTS PAIRING PROCEDURE WITH CAPACITANCE DATA

This final shorts pairing procedure completes the delineation of all nets or nodes involved in each short defect and produces the Final Shorts Report. The basic idea is to reduce table movement by pairing a group of nets with shorted partners for each cycle of table moves. To this end in Step 3 below the nets remaining to be paired are sorted into two groups, the Header List, and the Remainder List.

The first time Step 3 is encountered, the Remainder List is identical to the Augmented Shorts List described above. Step 3 reorganizes the Remainder List by pulling certain nets up into the Header List; the nets left behind constitute an updated Remainder List.

The reorganization procedure looks at all nets on the Remainder List and finds the lowest table position which still has nets on the Remainder List. Call this Table Position X. Only nets from Table Position X are considered for inclusion in the Header List.

The first net pulled up into the Header List is the net (on Remainder List) with the smallest value $X_m$. The second net is that net with the smallest $X_m$ which could not be a "possible short" to Header net #1, the third is that net with the smallest $X_m$ which could not be a "possible short" to Net #2 or Net #1 and so forth. The reorganization is complete when no more nets can be added to the Header List. The definition of "a possible short" is as defined above. "A possible short" for any net #p, with measured value $X_{mp}$ is any net k such that the $$Abs\ (X_{mk}-X_{mp})<a^*(X_{mk}+X_{mp})+2b.$$

All nets not pulled up into the Header List constitute a new Remainder List.

All nets on the Header List will have the same Table Position X. The Remainder List may have nets from Table Position X and all Table Positions following X.

The detailed Shorts Pairing procedure is illustrated FIG. 10I and is described as follows:

Step 1: (FIG. 10I, 440) Global Charging; The grid 48 is biased to voltage $V_{GRID\text{-}GLOBAL}$. The contacted conductive structure is biased to $V_{COND\text{-}GLOBAL}$. At each table position the substrate is flood irradiated by the flood guns 42, or by raster scanning primary beam 138.

Step 2: (FIG. 10I, 441) The potential on the lower grid 48 is biased to $V_{GRID\text{-}LOCAL}$. The potential of the contracted conductive structure 43 or 59 is changed to $V_{COND\text{-}LOCAL}$.

Step 3: (FIG. 10I, 442) The current Remainder List is sorted into a Header List and new Remainder List by the reorganization method described above.

Step 4: (FIG. 10I, 443) The NODE UNDER TEST is set to node #1 on the Header List.

Step 5: (FIG. 10I, 444) The table is positioned as required to expose NODE UNDER TEST to the focused probe beam. The focussed probe beam is directed to NODE UNDER TEST and unblanked.

Step 6: (FIG. 10I, 445) Beam unblanking is terminated when the induced current signal has declined to a value less than a predetermined value, i.e., $I_c < I_c$ LIMIT Step 7: (FIG. 10I, 446)

Is NODE UNDER TEST the last node on Header List?

If NO increment NODE UNDER TEST (FIG. 10I, 447) and go to Step 5 (FIG. 10I, 444).

If YES go to Step 8 (FIG. 10I, 448)

Step 8: (FIG. 10I, 448) The focused probe beam is directed in turn to each of the nodes listed in the Remainder List and briefly unblanked on each. If the amplitude of the induced current signal of any node is below the predetermined value, $I_c$ LIMIT, the net or net fragment containing said node is shorted to a node on the Header List. Because of the way the Header List was constructed there is only one entry in the Header List which qualifies as a "possible short". An entry is made in the Final Shorts Report that NODE UNDER TEST is shorted to the aforementioned "possible short", and NODE UNDER TEST is deleted from the Remainder List (to avoid redundant testing).

Step 9: (FIG. 10I, 449)

Is the Remainder List Empty?

If NO go to Step 3. (FIG. 10I, 442)

If YES, Shorts Pairing is complete and Final Shorts Report is complete. (FIG. 10I, 450)

The description of the Shorts Delineation using Capacitance Data is complete.

APPENDIX A

Characteristics of the Induced Current Signal

The purpose of this Appendix is to illustrate characteristics of the induced current signal relevant to the invention herein disclosed.

With reference to FIG. 3 we use the following symbols:

$I_p$ = primary beam current 333.
$I_s = \alpha\ I_p$; Secondary Electron (SE) current.
$I_b = \beta\ I_p$; Backscattered Electron (BSE) current 335.
$I_c$ = induced current signal which is identical to the net charging current of the floating conductor 331 of FIG. 3.
$I_r$ = Secondary Electron current returned to conductor 331.
V = potential of floating conductor 331.
$V_{eq}$ = equilibrium potential
C = capacitance of the conductor 331 relative to the outer conductor 332.
$\Phi$ = The work function of the irradiated material.

The outer sphere 332 is assumed to be at 0 Volts. If V > 0, some emitted SE will return to conductor 331. First an expression is derived for the return current $I_r$ as a function of V. It is assumed that the energy distribution of the SE is given by the formula of Chung and Everhart (1974) as follows:

$$\delta I_s(E)/\delta E = (6\Phi^2)E\ I_s/(E+\Phi)^4$$

where E is the initial kinetic energy of a SE.

It is also assumed that the potential V is small enough that $I_b$ contributes nothing to $I_r$. It follows that $$\delta I_r/\delta V = -6\Phi^2 I_s V/(V+\Phi)^4$$

Integrating one obtains the following:

$$I_r(V) = I_s(1-\Phi^2(3V+\Phi)/(\Phi+V)^3).$$

The charging current is given by $$I_c = -I_p + I_s + I_b - I_r$$

Substituting for $I_r$ and introducing $\Gamma = I_c/I_p$ one obtains $$\Gamma = \beta - 1 + \alpha\Phi^2(3V+\Phi)/(V+\Phi)^3 \qquad \text{Eq. 1}$$

$\Gamma(V)$ according to Eq. 1 is plotted in FIG. 4B. This equation can be solved for $V(\Gamma)$ as follows:

$$V(\Gamma) = -\Phi + m\cos(x) \qquad \text{Eq. 2}$$

where $$a = -3\ \Phi^2\alpha/(\Gamma+1-\beta);\ b = 2\ \Phi^3\alpha/(\Gamma+1-\beta)$$

$$m = 2\sqrt{-a/3}$$

$$x = \tfrac{1}{3}\cos^{-1}(3b/am).$$

The equilibrium potential, $V_{eq}$ is given by V(0), and is shown in FIG. 4A.

The time dependent behavior of $I_c(t)$ is derived as follows:

$$\delta I_c \delta t = (\delta I_c/\delta V)(\delta V/\delta t) \qquad \text{Eq. 3}$$

Since by definition C = Q/V one can write $$\delta V/\delta t = I_c/C$$

Substituting into Eq. 3 one obtains a differential equation for $I_c(t)$ as follows:

$$\delta I_c/\delta t - (I_c/C)(6\Phi^2 I_s \, V/(V+\Phi)^4) = 0 \qquad \text{Eq. 4}$$

This differential equation was solved numerically as follows:

An initial potential $V_i$ was chosen. $I_c$ corresponding to $V_i$ was calculated using Eq. 1. A new potential was calculated $$V(\delta t) = V_i + (I_c/C)\,\delta t$$

and so forth. $I_c$ calculated in this way is graphed in FIGS. 4C, 4D, and 4E.

Note as V approaches $V_{eq}$ the term in Eq. 4 multiplying $I_c$ becomes constant. In this case Eq. 4 can be approximated by the following equation:

$$\delta I_c/\delta t - (1/RC)\, I_c = 0, \qquad \text{Eq. 5}$$

where R is a constant.

This equation has simple exponential function solutions as follows:

$$I_c = I_o \, e^{-t/\Gamma}$$

where $\Gamma = RC = C\,(I_p)^{-1}\,(V_{eq}+\Phi)^4/(6\Phi^2 V_{eq}\,\alpha)$.

$I_c(t)$ is plotted on a semi-logarithmic scale in FIG. 4E to illustrate the region in which an exponential approximation is accurate. This region is where $I_c/I_{SAT} < = 0.3$, $I_{SAT}$ being the initial saturated signal level.

While this invention has been described in terms of specific embodiments as shown in the drawings and explained above, it will be manifest to those skilled in the art that alternative embodiments of the invention are contemplated within the ambit of this invention.

Having thus described the invention, what is claimed as new and desirable and desired to be secured by Letters Patent is as follows:

1. A method for measuring electrical characteristics of an electrical device having a conductive structure of conductors associated therewith, said method involving the sequence of steps as follows:
   a) employ a low energy electron beam to charge all conductors on a surface of said device to an initial equilibrium potential;
   b) expose individual conductors to a focussed low energy electron beam serially,
   c) make measurements of an induced current signal produced when individual conductors are exposed to said focussed electron beam;
   d) analyze induced current measurements derived from said individual conductors and provide an analysis; and
   e) determine electrical characteristics of said device based on the analysis, said electrical characteristics comprising electrical opens and electrical shorts.

2. The method of claim 1 wherein before exposure with said focussed electron beam, said device is subjected to a modified electrostatic field.

3. The method of claim 1 wherein said analysis of induced current signals is made by comparison of a feature of said induced current signals with a predetermined standard.

4. The method of claim 1 wherein said measurements are made of an induced current in a conductive structure external to said device.

5. The method of claim 1 wherein said measurements of induced current is made on internal metallization in said device.

6. The method of claim 1 wherein said measurements of induced current is made by a current amplifier.

7. A method in accordance with claim 1 wherein said measurements are analyzed to determine an electrical characteristic of a particular node.

8. The method of claim 7, further wherein said measurements are integrated to determine an electrical characteristic of a particular node to be tested on said device.

9. The method of claim 7, further wherein said measurements are fitted by a function to determine an electrical characteristic of a particular node to be tested on said device.

10. The method of claim 9, still further wherein said function for fitting said measurements is exponential.

11. A system for measuring electrical characteristics of an electrical device having a conductive structure of conductors associated therewith, said system comprising:
    a) means for employing a low energy electron beam to charge all conductors on a surface of said device to an initial equilibrium potential;
    b) means for exposing individual conductors to a focussed low energy electron beam serially,
    c) means for making measurements of an induced current signal produced when individual conductors are exposed to said focussed electron beam;
    d) means for analyzing induced current measurements derived from said individual conductors and providing an analysis; and
    e) means for determining electrical characteristics of said device based on the analysis, said electrical characteristics comprising electrical opens and electrical shorts.

12. The system of claim 11 wherein before exposure with said focussed electron beam, said system subjects said device to a modified electrostatic field.

13. The system of claim 11 wherein said analysis of induced current signals is made by comparison of a feature of said induced current signals with a predetermined standard.

14. The system of claim 11 wherein said measurements are made of an induced current in a conductive structure external to said device.

15. The system of claim 11 wherein said measurements of induced current is made on internal metallization in said device.

16. The system of claim 11 wherein said measurements of induced current is made by a current amplifier.

17. A system in accordance with claim 11 wherein the measurements are analyzed to determine an electrical characteristic of a particular node.

18. The system of claim 17 wherein said measurements are integrated to determine an electrical characteristic of a particular node to be tested on said device.

19. The system of claim 17 wherein said measurements are fitted by a function to determine an electrical characteristic of a particular node to be tested on said device.

20. The system of claim 19 wherein said function for fitting said measurements is exponential.

* * * * *